United States Patent [19]

Arakawa et al.

[11] Patent Number: 5,608,236
[45] Date of Patent: Mar. 4, 1997

[54] SEMICONDUCTOR DEVICE

[75] Inventors: Hidetoshi Arakawa, Kitaibaraki; Yoshitaka Sugawara; Masamitsu Inaba, both of Hitachi, all of Japan

[73] Assignees: Hitachi, Ltd., Tokyo; Hitachi Haramichi Electronics Co., Ltd., Ibaraka, both of Japan

[21] Appl. No.: 404,465

[22] Filed: Mar. 15, 1995

[30] Foreign Application Priority Data

Mar. 18, 1994 [JP] Japan .................................. 6-048262
Mar. 22, 1994 [JP] Japan .................................. 6-073780

[51] Int. Cl.$^6$ ........................ H01L 29/74; H01L 31/111
[52] U.S. Cl. ........................................ 257/123; 257/122
[58] Field of Search ................................. 257/123, 122, 257/516, 510, 511

[56] References Cited

U.S. PATENT DOCUMENTS

| | | | |
|---|---|---|---|
| 3,631,311 | 12/1971 | Engbert et al. | 257/582 |
| 4,231,056 | 10/1980 | Taylor | 257/516 |
| 4,949,153 | 8/1990 | Hirao et al. | 257/516 |
| 4,967,246 | 10/1990 | Tanaka . | |
| 5,293,051 | 3/1994 | Mariyama | 257/122 |

FOREIGN PATENT DOCUMENTS

| | | |
|---|---|---|
| 0103306 | 3/1984 | European Pat. Off. . |
| 0404095 | 12/1990 | European Pat. Off. . |
| 4032816 | 4/1994 | Germany . |
| 59-127865 | 7/1984 | Japan . |
| 1428742 | 3/1976 | United Kingdom . |

*Primary Examiner*—Stephen Meier
*Attorney, Agent, or Firm*—Antonelli, Terry, Stout & Kraus, LLP

[57] ABSTRACT

A semiconductor device includes an emitter region, a collector region provided directly under the emitter region, and a two-region base structure. The first base region is interposed between the emitter and collector regions, and the second base region supports the collector region. The aforementioned regions have a progressively higher impurity concentrations, with the collector region having an impurity concentration higher than that of the first base region, the second base region having an impurity concentration higher than that of the collector region, and the emitter region having an impurity concentration higher than that of the base region. Also included is a resistance region formed, in one embodiment, from a projecting end portion of one of the base layers. The projecting end portion of the base is fabricated so that both base portions contact one another in the resistance region, and consequently both base portions are of the same potential. Electrodes are also provided for ohmically contacting the emitter, collector, and base regions. The two-region base structure enables the device to achieve a high resistance, and thus to achieve simultaneously a high breakdown voltage and a high frequency (speed) characteristic.

18 Claims, 11 Drawing Sheets

5,608,236

SEMICONDUCTOR DEVICE

BACKGROUND OF THE INVENTION

The present invention relates to a semiconductor device and, in particular to a high breakdown voltage and a high speed bipolar type semiconductor device suitable for use in an integrated circuit, such as a high breakdown voltage and a high speed bipolar type transistor.

As for a transistor for use in a power IC or in LSI and transistor for a signal, a high breakdown voltage and a high speed bipolar type semiconductor device is required. However, in a single transistor, it is difficult to achieve the characteristics of high speed and high breakdown voltage at the same time.

More specifically, it is often the case with prior art devices of the above-mentioned type that when one characteristic is improved, another characteristic is sacrificed to some degree. For example, in order to obtain a high speed transistor, a base width of the transistor is made narrow. Consequently, breakdown voltage is sacrificed.

Because a high breakdown voltage and high speed in a bipolar type transistor cannot realized in practical terms, as is especially the case with a bipolar linear type IC, the following problems will occur.

In the bipolar linear-type IC, in order to increase the degrees of freedom for designing a circuit and to simplify a circuit structure, both n-p-n transistor and p-n-p transistor are used together. For such a configuration, in order to lessen a number of manufacturing processes, the n-p-n transistor is formed with a vertical type structure and the p-n-p transistor is formed with a horizontal (lateral) type structure.

In the lateral type p-n-p transistor, in an "off" condition, a depletion layer spreads out to a semiconductor base substance region having a low impurity concentration. As such, it is necessary to prevent a punch-through phenomenon in which the depletion layer reaches to an emitter junction and then the current flows.

For this reason, an interval (base width) between an emitter region and a collector region is formed wider than the width of the depletion layer in the voltage to be checked by the transistor. As a result, an operation frequency of the lateral type p-n-p transistor lowers remarkably compared with that of the vertical structure n-p n transistor.

As an element structure for solving the problems in the above stated lateral type transistor, p-n-p transistor disclosed in Japanese patent laid-open publication No. 127865/1984 is known.

In this n-p-n transistor, n-type base region is formed on one main surface side of n-type base substance region. This n-type base region has a higher impurity concentration than that of the base substance region, and a p-type emitter region is formed in this n-type base region.

In the same base substance region, a first p-type collector region is formed separately from the n-type base region. Further, a second p-type collector region is formed so as to contact to the first p-type collector region and further so as to surround around the n-type base region. The second p-type collector region has a lower impurity concentration than those of the first p-type collector region and the n-type base region.

In a p-n-p transistor having the above stated structure, the depletion layer mainly spreads out toward the second collector region having the low impurity concentration. Accordingly, even though the width of the n-type base region is formed to be narrow, the pinch-through phenomenon does not occur. As a result, both the breakdown voltage and the operation frequency in the p-n-p transistor can be improved at the same time.

There is, however, at least one limitation associated with using the above-stated lateral type n-p-n transistor. This limitation relates to the obtainment for the high frequency. Namely, the cutoff frequency $f_T$ is 70 $MH_z$ degree at the breakdown voltage of 100 V, and in the breakdown voltage of 350 V the cutoff frequency $f_T$ is 25 $MH_z$ degree. These cutoff frequency $f_T$ values are $\frac{1}{5}-\frac{1}{10}$ in comparison with the value in the n-p-n transistor having the same breakdown voltage.

For the above reasons, performance of bipolar linear type ICs are limited by the characteristics of the lateral type p-n-p transistor.

Moreover, in general, in a power IC, LSI and a transistor for signal, a high breakdown voltage, a high current amplification factor and a high speed transistor is needed. However, it is difficult to realize the above-stated characteristics at the same time.

In order to realize the high current amplification factors required, methods are known in the prior art for thinning a base region according to under the scarification of the breakdown voltage, and methods are known for forming a Darlington transistor structure according to under the scarification in speed.

For example, in a bipolar linear type IC, serious adverse effects occur when a high breakdown voltage, a high current amplification factor, and a high speed bipolar type transistor are not realized at the same time. This is so because, in the lateral structure n-p-n transistor, a collector conjunction breakdown voltage is attained by the spread of a depletion layer in a base region (semiconductor base substance region) having a low concentration.

In order to prevent a punch-through phenomenon an interval (base width) between an emitter and a collector is designed to be wider than the width of the depletion layer in a design breakdown voltage in a collector conjunction. As a result, the current amplification factor is lowered remarkably compared with the vertical structure transistor.

In order to solve the above stated problems in the lateral type transistor, various kinds of the element structures have been proposed. One p-n-p transistor is disclosed, for example, in the above-stated Japanese patent laid-open No. 127865/1984.

With the above stated transistor structure, during a low voltage application time, the second p-collector region becomes the collector, and during a high voltage application time the depletion layer spreads out in the second p-collector region, and further the first collector becomes the collector.

As a result, the current amplification factor, the cutoff frequency, and the breakdown voltage of the transistor can be improved at the same time.

However, the above transistor structure pays no attention to the base resistance during use of the linear IC, and since the base resistance is large, a problem occurs in which the noise voltage is made large. In order to solve this problem, a transistor structure shown in Japanese patent laid-open No. 132037/1991 is well known.

In the above transistor structure, a part of the first collector region for surrounding around the n-base region in the p-n-p transistor disclosed in the above stated Japanese patent laid-open No. 127865/1984 is released.

In the released part the n-base region having a high impurity concentration is connected to a second base region having high impurity concentration for use in an external portion base electrode of the first collector region.

According to this transistor structure, the base resistance can be made small, as a result the p-n-p transistor having the low noise voltage can be formed.

An example with respect to the p-n-p transistor having the high breakdown voltage and the high speed linear type IC as an exemplified and representative problem will be explained.

In order to realize the high breakdown voltage and the higher speed linear type integrated circuit (IC), a plan view and a cross-sectional view showing the lateral type p-n-p transistor disclosed in the above stated Japanese patent laid-open No. 132047/1991 are shown in FIG. 21 and FIG. 22.

In order to improve the cutoff frequency, when a width of the n-base region 202, forming an effective operation region between p-emitter region 203 and p-collector region 206, is narrow, the contribution degree afforded to the base resistance and the collector resistance becomes large. Consequently, the base resistance and the collector resistance are needed to be reduced.

Moreover, in order to obtain a high breakdown voltage, the length of the second collector region 206, working as the electric field relaxation region between the n-base region 202 and the first p-collector region 204, becomes longer. As a result, the collector resistance increases. Further, the distance of the second n-base region 205 drawn from the n-base region 202 becomes long, and as a result the base resistance increases.

In order to reduce the resistances, the base impurity concentration of the drawn-out portion is made higher than that of the first n-base region 202. During the reversal bypass application time of the transistor, the electrolyte concentration at the contact portion of the impurity material at the second p-collector region 206 and the second n-base region 205 is remarkable, thereby a lowering in the breakdown voltage is invited.

In order to prevent a lowering in the breakdown voltage, a lowering in the impurity concentration of the second collector region 206 is needed. As a result, the collector resistance increases and a lowering in the cutoff frequency occurs.

Moreover, in this transistor, in order to increase the current capacity, the emitter region 203 is made long toward an opposite side of the second n-base region 205, since the relation between the first n-base region 202 and p-emitter region 203 is determined according to the current amplification factor.

As a result, during the high current operation time, the voltage between the emitter and the base become low, going to toward an opposite side of the direction of the second n-base region 205. Because of a non-uniformity in the voltage between the emitter and the base, a lowering in the current amplification factor, the cutoff frequency, and the noise voltage in the high current region occur.

SUMMARY OF THE INVENTION

An object of the present invention is to provide a lateral type semiconductor device wherein frequency (speed) characteristics are improved without sacrificing breakdown voltage.

Another object of the present invention is to provide a semiconductor device, and in particular a bipolar type transistor, wherein a superior noise characteristic, a high breakdown voltage characteristic, and a high frequency characteristic can be obtained without the scarification of the breakdown voltage.

According to the present invention, a semiconductor device comprises: a first conductive type semiconductor base substance; a second conductive type first semiconductor region provided on a main surface of the semiconductor base substance; a first conductive type second semiconductor region provided on the first semiconductor region and having an impurity concentration higher than that of the first semiconductor region; a second conductive type third semiconductor region provided on the second semiconductor region; a resistance region for connecting the semiconductor base substance and the second semiconductor region; a first electrode for ohmicly contacting to the first semiconductor region; a second electrode for ohmicly contacting to the second semiconductor region; and a third electrode for ohmicly contacting to the third semiconductor region.

Namely, the second conductive type first semiconductor region is provided on the main surface of the semiconductor base substance. The first conductive type second semiconductor region having the impurity concentration higher than that of the first semiconductor region is provided on the second semiconductor region. Further, the second conductive type third semiconductor region is provided on the second semiconductor region. Herein, the semiconductor base substance and the second semiconductor region are connected through the resistance region. In each of the semiconductor regions, each of the electrodes ohmicly contacts, respectively.

According to the present invention, in the lateral type semiconductor device, the operation can be made speedy without the lowering in the breakdown voltage. As a result, since the lateral type semiconductor device having the equal frequency characteristic those of the vertical structure semiconductor device can be realized, thereby the performance of the bipolar linear type IC using both semiconductor devices together can be improved.

Further, so as to solve the above stated problems, according to the present invention, a semiconductor device comprises: a first conductive type first semiconductor region; a first conductive type second semiconductor region extended to an interior portion from one main surface of the first semiconductor device; a second conductive type third semiconductor region extended to an interior portion from an exposed face of the second semiconductor region and having a higher impurity concentration than that of the second semiconductor region; a second conductive type fourth semiconductor region extended to an interior portion from the one main surface of the first semiconductor region and having a circular shape opened exposed face, the fourth semiconductor region for substantially surrounding around the second semiconductor region and having a higher impurity concentration than that of the first semiconductor region; a first conductive type fifth semiconductor region extended to an interior portion from the one main surface of the first semiconductor region and one end thereof connected to the second semiconductor region and other end thereof passed through the opened portion of the fourth semiconductor region and separately extending to the second semiconductor region, the fifth semiconductor region having a higher impurity concentration than that of the first semiconductor region and than that of the second semiconductor region; a second conductive type sixth semiconductor region positioned between the second semiconductor region and the fourth semiconductor region and contacted to the second semiconductor region and the fourth semiconductor region, the sixth semiconductor region extended to an interior portion from the one main surface of the first semiconductor region in a space at an outer peripheral side of the fifth semiconductor region, the sixth semiconductor region having a higher impurity concentration than that of the first semiconductor region and having a lower impurity concentration than that of the fourth semiconductor region; a first electrode for ohmicly contacting to a first opened portion which forms an exposed surface of the third semiconductor region through an insulating material which is formed on the second semiconductor region and on one main surface of at least part of the sixth semiconductor region; a second electrode for ohmicly contacting to a second opened portion which forms an exposed face of the fourth semiconductor region; and a third electrode for ohmicly contacting to a third opened portion which forms an exposed face of the fifth semiconductor region.

In the above stated semiconductor device, in the third semiconductor region, the first opened portion of the exposed face may ohmicly contact by separating and biasing from the fifth semiconductor region and further the portion except for being not opposed to the fourth semiconductor region may partially removed in the shape.

Further, in the above stated semiconductor device, at the side of the one main surface for opposing to the fourth semiconductor region, the first type seventh semiconductor region is formed.

The above stated seventh semiconductor region is smaller than at least second semiconductor region and extends to the interior portion from the one main surface of the first semiconductor region and further is deeper than the second semiconductor region and has the lower impurity concentration than that of the third semiconductor region.

Further, in the above stated semiconductor device, the first semiconductor region may be one of the plural island regions which are put side by side by mutually and electrically insulating one main surface side of the semiconductor base substance.

As stated in the above, according to the present invention, in particularly to in the lateral type bipolar transistor device, it avoids the contact between the high impurity concentration of the second n-base region which has the high impurity concentration fifth semiconductor region for supplying the base current and the high impurity concentration of the second p-collector region which has the low impurity concentration sixth semiconductor region.

Thereby, during the application time of the reverse bias to the transistor, the electric field of the conjunction portion is relaxed, as a result the lowering in the breakdown voltage can be prevented.

Accordingly, without the lowering in the impurity concentration of the second p-collector region which is the sixth semiconductor region, namely without the increase in the collector resistance, the cutoff frequency can be prevented from lowering.

Further, so as to increase the current capacity when the length of the p-emitter region forming the third semiconductor region is lengthened, in accompanying to from the separation from the second n-base region forming the fifth semiconductor region, the first n-base region forming the second semiconductor region is punched by the emitter region forming the third semiconductor region and becomes the high resistance.

Thereby, during the transistor operation time, because of the bias of the emitter current the lowering in the current amplification factor and the lowering in the cutoff frequency become remarkably.

For that reasons, so as to obtain the low resistance of the first base region forming the second semiconductor region, as one means the impurity diffusion layer forming the seventh semiconductor region is provided at the bottom portion of the p-emitter region forming the third semiconductor region except for effective base region of this transistor and the above impurity diffusion layer becomes the low resistance.

The central portion of the p-emitter region forming not oppose to the effective base region and forming the third semiconductor region is removed and the base diffusion layer is exposed, the high resistance by the punch of the emitter diffusion from the first base diffusion layer can be prevented.

Further, so as to obtain the high current for the cutoff frequency, as an aim for the prevention of the non uniformity of the voltage between the emitter and the base in the emitter conjunction separated from the base electrode, in the emitter region forming the third semiconductor region, the emitter electrode forming the first electrode may provide separately and biasedly from the base electrode forming the third electrode.

The above stated semiconductor device according to the present invention can be used suitably for use in the high frequency p-n-p transistor in the linear type IC.

According to the present invention, in the high breakdown voltage bipolar type transistor, since the second base region forming the fifth semiconductor region does not contact to the p-collector region forming the low impurity concentration sixth semiconductor region, the portion in which the electric field concentrates during the voltage application time in the conventional semiconductor device structure can be avoided.

Accordingly, the lowering in the breakdown voltage does not occur and the sheet resistance of the second p-collector region forming the sixth semiconductor region can be lowered, as a result the collector resistance can be made small and the cutoff frequency can be improved.

Further, so as to reduce the emitter bias effect in the high current, the low impurity concentration region of the base is provided under the emitter or the emitter region forming not the effective emitter region is removed and further the contact position in the emitter region is separately arranged from the base electrode.

As a result the uniformity in the voltage between the emitter region and the base in the emitter conjunction and the reduction of the base resistance can be attained, thereby the cutoff frequency can be improved as far as the high current region.

According to the semiconductor device of the present invention, the collector resistance can be made small without the lowering in the breakdown voltage, as a result, the high frequency can be obtained.

Further, so as to make large the current capacity when the emitter region length is lengthen the current capacity substantially corresponding to the emitter region length can be obtained, the high frequency p-n-p transistor suitable for the high frequency linear type IC can be provided.

DESCRIPTION OF THE INVENTION

Figure 1:
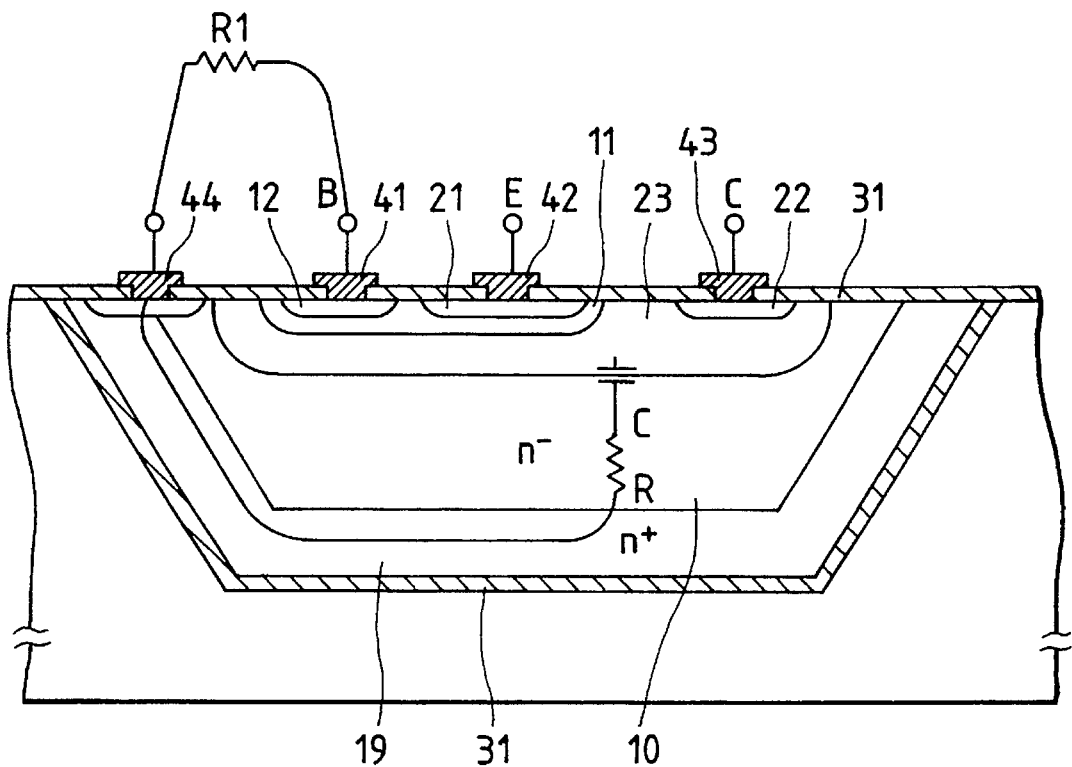
FIG. 1 is a cross-sectional view for explaining a principle structure of a semiconductor device according to the present invention.

Hereinafter, various embodiments of semiconductor devices will be explained referring to the drawings.

According to the above stated features of the present invention, the reasons in which in the lateral type semiconductor device wherein without the sacrifice of the breakdown voltage the frequency characteristics can be improved will be explained as followings.

First of all, a principal structure of a semiconductor device according to the present invention. FIG. 1 is a cross-sectional view for explaining a principal structure of a semiconductor device according to the present invention. In a lateral type semiconductor device shown in FIG. 1, p-type collector region 23 is provided on a main surface of an n-type semiconductor base substance (n−) 10.

An n-type base region 11, formed as a second semiconductor region, is provided on p-type collector region 23. The impurity concentration of n-type base region 11 is higher the impurity concentration of p-type collector region 23. A p-type emitter region 21 and a region (n+) 12 having a higher impurity concentration than that of the n-type base region 11 are provided in the n-type base region 11.

Further, an insulating film 31 comprised of a silicon oxide and a buried layer 19 are provided on the semiconductor device. A collector electrode C (a first electrode) 43 is provided on a p+ region 22 of the p-type collector region 23, a base electrode B (a second electrode) 41 is provided on the p+ region 12 of the n-type base region 11, and an emitter electrode E (a third electrode) 42 is provided on the exposed portion of the p-type emitter region 42, respectively.

A base electrode 41 is provided on the region (n+) 12 and an auxiliary electrode 44 is provided on the semiconductor base substance 10. An external resistor R1 is connected to between the auxiliary electrode 44 and the base electrode 41. Namely, the semiconductor base substance 10 and the n-type base region 11 are connected through the resistor R1.

Figure 2:
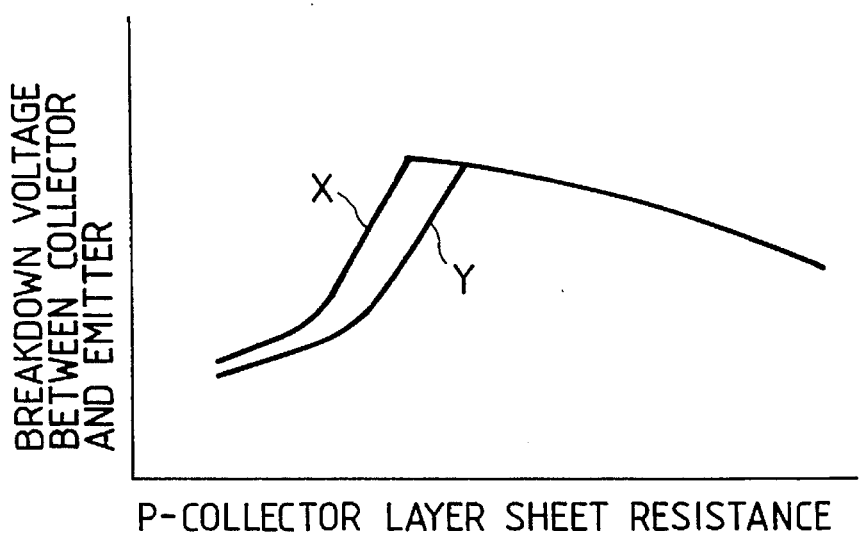
FIG. 2 is a graph showing a relationship between a sheet resistance of p-type collector region and a breakdown voltage between a collector electrode and an emitter electrode.

FIG. 2 is a graph showing an examination study by the inventors of the present invention with respect to a relationship between a sheet resistance of the p-type collector region 23 and a breakdown voltage between a collector electrode and an emitter electrode in the semiconductor device shown in FIG. 1.

Shown in FIG. 2 are in one case the examination results in which the external resistor R1 is connected between the auxiliary electrode 44 and the base electrode 41. This case is shown by a curve line X. Another case in which the interval between the auxiliary electrode 44 and the base electrode 41 is not connected through a resistor is shown by a curve line Y.

In either case, as the sheet resistance of the p-type collector region becomes small, the breakdown voltage lowers. However, in the case in which the resistor R1 is connected between the auxiliary electrode 44 and the base electrode 41, the lowering degree of the breakdown voltage is small.

Figure 3:
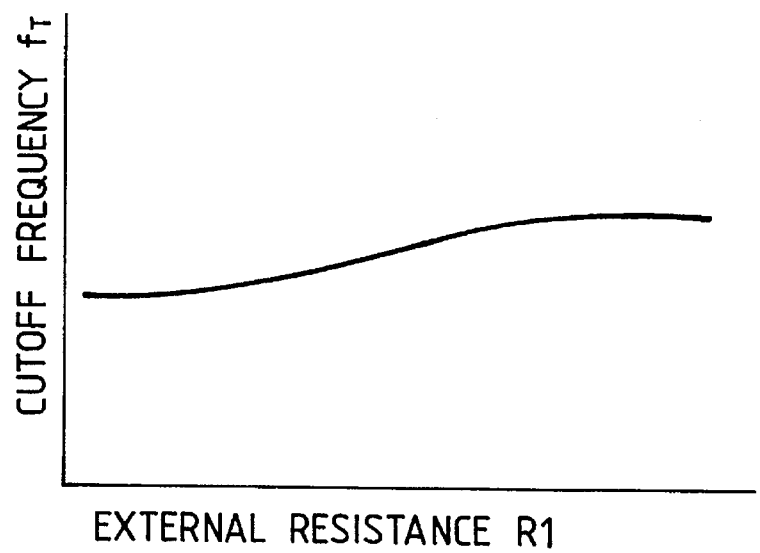
FIG. 3 is a graph showing a relationship between an external resistance between an auxiliary electrode and a base electrode and a cutoff frequency.

FIG. 3 is a graph showing an examination study by the inventors of the present invention wherein the external resistor R1 between the auxiliary electrode 44 and the base electrode 41 is plotted against the cutoff frequency $f_T$.

When the value of resistor R1 is made large, cutoff frequency $f_T$ becomes higher. This is that in FIG. 1 a conjunction capacity C between p-type collector region 23 and the n-type semiconductor base substance 10 is connected to the n-type base region 11 through a resistance part R of the semiconductor base substance 10 and the resistor R1 between the auxiliary electrode 44 and the base electrode 41.

Namely, within the signal current for supplying the base electrode 41, a part being the charging current for the conjunction capacity C is restrained due to the resistor R1, as a result a net base current to be contributed for the carrier injection from the p-type emitter region 21 increases.

As stated in above, in the lateral type semiconductor device according to the present invention, the semiconductor base substance 10 and the semiconductor region forming the base region are connected by the resistor R1, and by increasing the resistance value, the cutoff frequency $f_T$ can be improved. Further, by the provision of the resistor R1 the lowering of the breakdown voltage can be prevented.

Hereinafter, one embodiment of a semiconductor device according to the present invention will be explained in detail.

Figure 4:
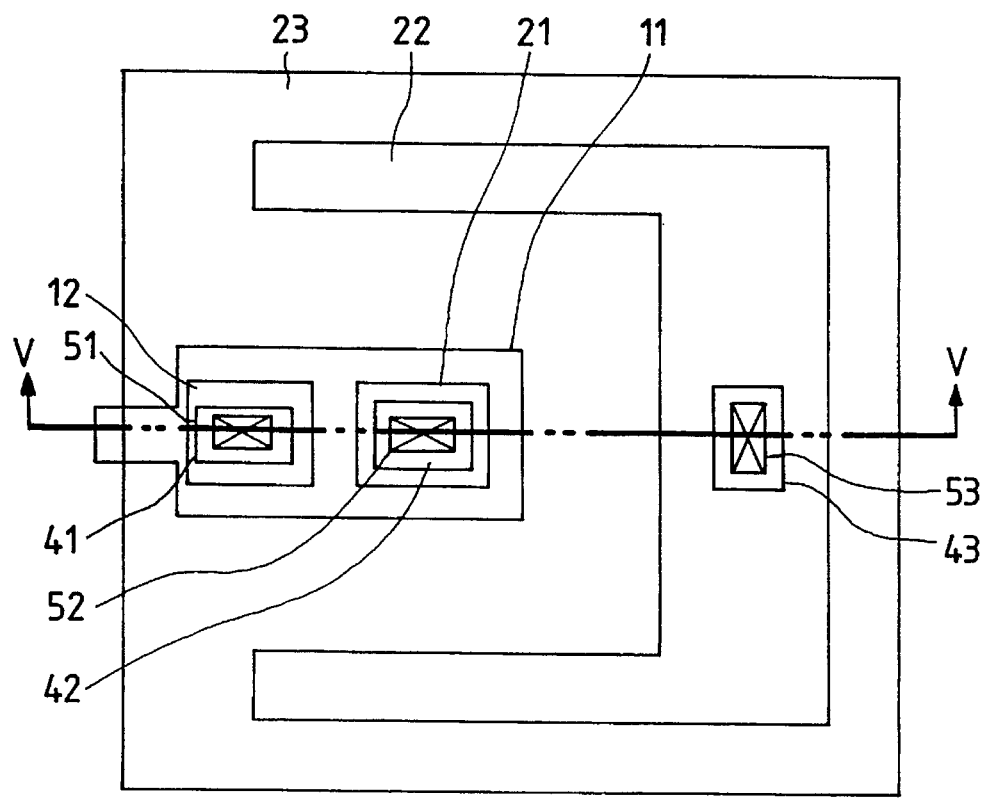
FIG. 4 is a plan view showing a first embodiment of a semiconductor device according to the present invention.
Figure 5:
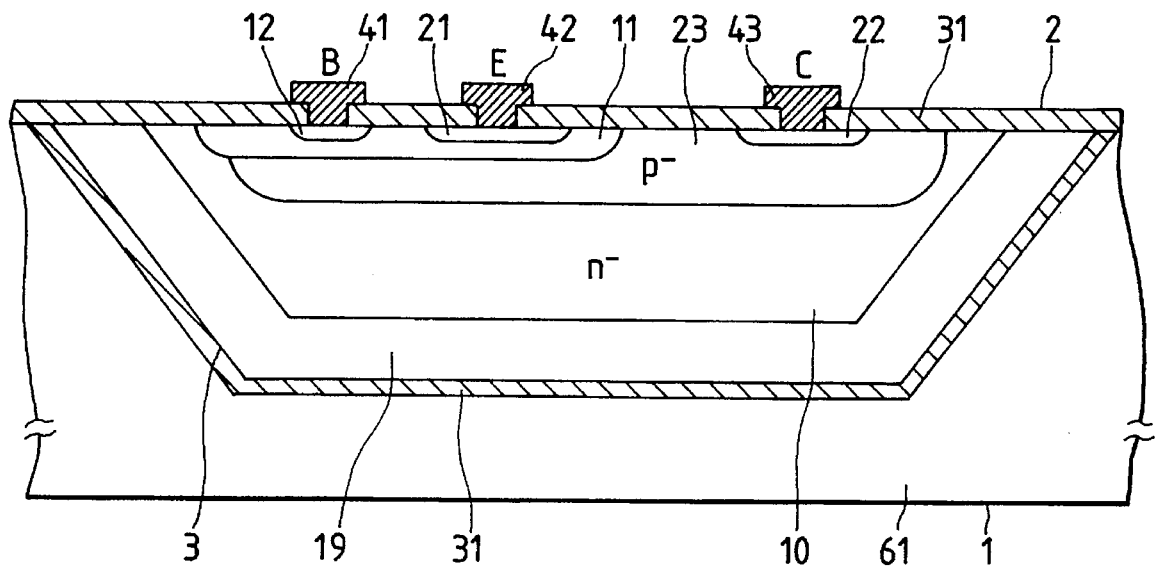
FIG. 5 is a cross-sectional view showing the first embodiment of the semiconductor device according to the present invention and taken along to a line V—V of FIG. 4.

FIG. 4 and FIG. 5 show a first embodiment of a semiconductor device according to the present invention. This first embodiment shows a lateral type p-n-p transistor which is formed on a dielectric body isolating substrate.

First of all, a cross-section structure of the first embodiment of the lateral type p-n-p transistor according to the present invention will be explained referring to FIG. 5.

In a dielectric body isolating substrate 1, a monocrystalline island shape region 3 is provided on a supporting member 61 comprised of a poly-crystalline silicon, and the supporting member 61 and the island shape region 3 are separated by an insulating film 31 comprised of a silicon oxide.

The mono-crystalline island shape region 3 has n-type buried layer 19 and n-type semiconductor base substance 10, this semiconductor base substance 10 is adjacently provided with the buried layer 19.

p-type collector region (a first semiconductor region) 23 is provided on a side of a main surface 2 of the monocrystalline island shape region 3 of the dielectric body isolating substrate 1. n-type base region (a second semiconductor region) 11 is provided on this p-type collector region 23.

A conjunction depth of this n-type base region 11 is shallower than that of the p-type collector region 23. An impurity concentration of the n-type base region 11 is larger than that of the p-type collector 23. The n-type base region 11 is connected to the n-type semiconductor base substance 10 at an end portion (a left end portion in FIG. 5) in which the n-type base region 11 contacts to the main surface 2.

Further, p-type emitter region (a third semiconductor region) 21 is provided in the n-type base region 11. A conjunction depth of this p-type emitter region 21 is shallower than that of the n-type base region 11 and an impurity concentration of the p-type emitter region 21 is larger than that of the n-type base region 11.

The p-type collector region 23 is positioned just directly under the p-type emitter region 21. In the first embodiment of the present invention, the p-type collector region 23 is positioned just directly under the p-type emitter region 21 all over, however the p-type collector region 23 may be positioned just directly partially under the p-type emitter region 21.

Almost all of main surface 2 is covered by the insulating film 31, comprised of silicon oxide. By partially removing the insulating film 31, the surfaces of the p-type collector region 23, the n-type base region 11 and the p-type emitter region 21 are exposed.

Herein, p+ region 22 is provided at the exposed portion of the p-type collector region 23, and an impurity concentration of the p+ region 22 is larger than that of the p-type collector region 23. Further, p+ region 12 is provided at the exposed portion of the n-type base region 11, and an impurity concentration of the p+ region 12 is larger than that of the n-type base region 11.

An electrode is provided, respectively, on each of the above exposed portions. Namely, as shown in FIG. 4, a collector electrode C (a first electrode) 43 is provided on the p+ region 22 of the p-type collector region 23, a base electrode B (a second electrode) 41 is provided on the p+ region 12 of the n-type base region 11, and an emitter electrode E (a third electrode) 42 is provided on the exposed portion of the p-type emitter region 42.

All of the p-type collector region 23, the n-type base region 11, the p-type emitter region 21, the p+ region 22 and the n+ region 12 are formed according to a commonly thermal diffusion method.

Next, a planar structure of the semiconductor device of this first embodiment according to the present invention will be explained referring to FIG. 4.

The p-type collector region 23 has a square shape pattern or a rectangular shape pattern. This n-type collector 23 region surrounds around almost all of the n-type base region 11, namely as shown in FIG. 4, the n-type collector region 23 surrounds around a region on which the p-type emitter region 21 and the n+ region 12 are provided.

A projecting portion is provided at an end portion (a left end portion in FIG. 4) and this projecting portion extends over the p-type collector region 23 and the n-type semiconductor base substance 10.

This projecting portion forms a resistance region for connecting the n-type base region 11 and the n-type semiconductor base substance 10. A resistance value is adjusted according to the dimension of the projecting portion. Further, the projecting portion may have a different conjunction depth and a different impurity concentration with the n-type base region 11, when the projecting portion is formed with a conductive type semiconductor region same as the n-type base region 11.

In the above case, it is possible to adjust the resistance value according to both the dimension and the impurity concentration of the projecting portion, and to thereby set a wide range for the resistance value.

Further, the p+ region 22 in the p-type collector region 23 opposes to a surrounding portion of the n-type base region 11, except for the above stated projecting portion.

An example of the dimension and the impurity concentration of the respective part according to the semiconductor device of this first embodiment of the present invention will be explained as follows.

A thickness of the mono-crystalline island shape region 3 is 40 μm, the maximum impurity concentration and a diffusion depth of the n-type buried layer 19 are $5\times10^{18}/cm^3$ and 11 μm, and a resistivity of the n-type semiconductor base substance 10 is 20 Ω·cm.

A sheet resistance and a diffusion depth of the p-type collector region 23 provided on the main surface 2 side of the mono-crystalline island shape region 3 are 8 kΩ/□ and 9 μm.

A surface concentration and a diffusion depth of the n-type base region 11 are $1\times10^{17}/cm^3$ and 2 μm, and a surface concentration and a diffusion depth of the p-type emitter region 21 are $5\times10^{19}/cm^3$ and 0.5 μm.

A surface concentration and a diffusion depth of the p+ region 22 are $5\times10^{19}/cm^3$ and 0.5 μm, and a surface concentration and a diffusion depth of the n+ region 12 are $1\times10^{20}/cm^3$ and 0.4 μm. Further, a sheet resistance value of the p-type collector region 23 positioned just directly under the n-type base region 11 is 15 kΩ/□.

The dimension except for the projection portion of the n-type base region 11 is 45 μm×15 μm, and each of a dimension of the p-type emitter region 21 and the p+ region 12 provided on the n-type base region 11 is 15 μm×9 μm, and an interval between the p-type emitter region 21 and the p+ region 12 is 5 μm.

A vertical direction of the n-type base region 11 is the same vertical directions of the p-type emitter region 21 and the p+ region 12. An interval between the p-type emitter region 21 and the p+ region 12 and the p-type collector region 23 is 3 μm in a portion except for the projecting portion of the p-type collector region 23.

The projecting portion of the n-type base region 11 projects 5 μm toward the n-type semiconductor base substance 10 from the end portion of the p-type collector region 23. At the p+ region 22, a width of the region parallel to the vertical direction of the n-type base region 11 is 6 μm, and a width of the region vertical to the vertical direction of the base region 11 is 15 μm.

In the vertical direction of the n-type base region 11 an interval between the n-type base region 11 and the p+ region 22 is 20 μm. A distance between an end portion of the p+ region 22 and an end portion of the p-type collector region 23 is 15 μm at a portion except for the projecting portion of the n-type base region 11.

Further, each dimension of opening portions 51 and 52 for taking out the electrodes in the insulating film 31 is 3 μm×9 μm, and a dimension of an opening portion 53 is 9 μm×3 μm.

According to this first embodiment, the projection portion continuously provided on the n-type base region 11 forms the resistance region. The conjunction capacity of the p-type collector region 23 and the n-type semiconductor base substance 10 connected to the n-type base region 11 through the resistance part of the resistance region comprised of the projecting portion and the semiconductor base substance 10.

As a result, according to the above resistance region and the resistance part the base current being given to the base electrode 41 is restrained to make the charging current of the conjunction capacity.

Thereby, even when the frequency of the base current becomes high, since the net base current for contributing the carrier injection from the p-type emitter region does not reduce, the cutoff frequency can be made high.

Further, since an interval between the n-type base region 11 and the semiconductor base substance 10 does not present the open condition, thereby the breakdown voltage can be improved.

According to the results by the inventor's study of the present invention, for example, in the case of the lateral type p-n-p transistor having the above stated dimensions and the impurity concentrations, the breakdown voltage between the collector and the emitter is 250 V and the cutoff frequency is 280 MH$_z$ at the collector current of 0.7 mA. This value of the cutoff frequency is extremely higher than that of the conventional semiconductor device.

Further, this first embodiment has following effects. As shown in FIG. 4, the p-type collector region 23 is positioned just directly under the p-type emitter region 21.

As a result, the current flowing into the p-type collector region 23 from the p-type emitter region 23 flows toward for a lateral direction along to the main surface and also flows toward a direction of the p-type collector region 23 positioned just directly under the p-type emitter region 21, namely toward for a vertical direction.

Consequently, since the current concentration in the transistor becomes small, the current amplification factor becomes large and the "on" voltage becomes low.

In the semiconductor device of this first embodiment according to the present invention, so as to secure the breakdown voltage between the p-type collector region 23 and the n-type substrate which corresponds to the potential difference between the collector electrode and the semiconductor base substance 10 in the use condition of the p-n-p transistor, a distance between the end portion of the p+ region 22 and the end portion of the p-type collector region 23 is secured with 15 μm.

However, this portion will be formed through another electric field relaxation method, for example, a field plate formation etc. and the similar effects can be obtained, and then the reliability can be further improved.

Further, the dimension and the impurity concentration of each semiconductor region will not limited to the above stated numerical values but may select other suitable values. For example, the depth of the p+ region 22 is 0.5 μm but the deeper depth than the above may be selected, even in this case then the element characteristic does not receive the affects.

Figure 6:
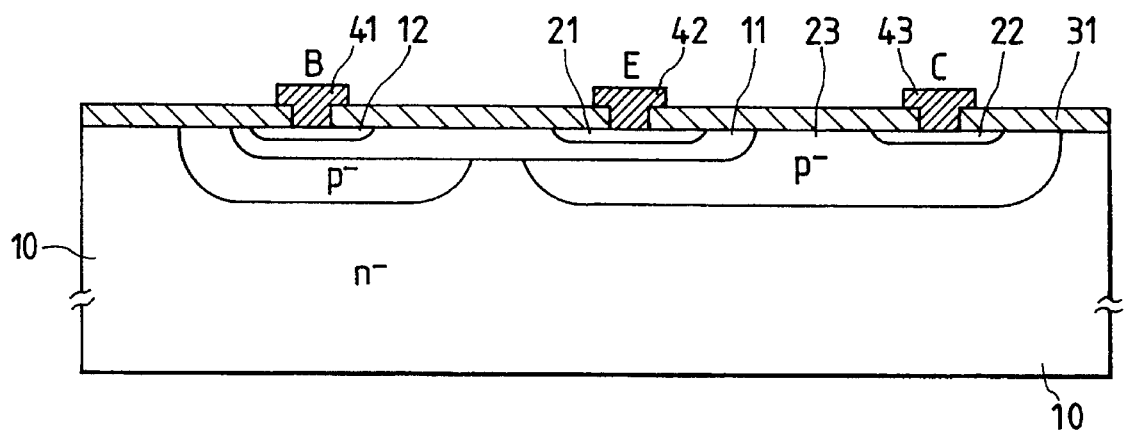
FIG. 6 is a cross-sectional view showing a second embodiment of a semiconductor device according to the present invention.

FIG. 6 shows a cross-sectional structure of p-n-p transistor of a second embodiment according to the present invention. In this second embodiment, the n-type base region 11 is provided in the interior portion of the p-type collector region 23. Namely, in this second embodiment of the present invention, an end portion of the n-type base region 11 does not project toward for the n-type semiconductor base substance 10, as shown in the former first embodiment of the present invention.

Just directly under the n-type base region 11, a portion is formed, however on this portion the p-type collector region 23 is not provided. This portion forms a resistance region and at this portion the n-type base region 11 and the n-type semiconductor base substance 10 are connected to each other.

As a result, in this second embodiment according to the present invention, similar to the former first embodiment of the present invention, the cutoff frequency can be improved without the lowering in the breakdown voltage.

Further, in this second embodiment of the present invention, a resistance value of the resistance region can be adjusted according to the shape and the dimension of the portion on which the p-type collector region 23 does not provided.

Accordingly, only changing a host mask pattern during the formation of the p-type collector region, the resistance value of the resistance region can be easily and widely adjusted.

Figure 7:
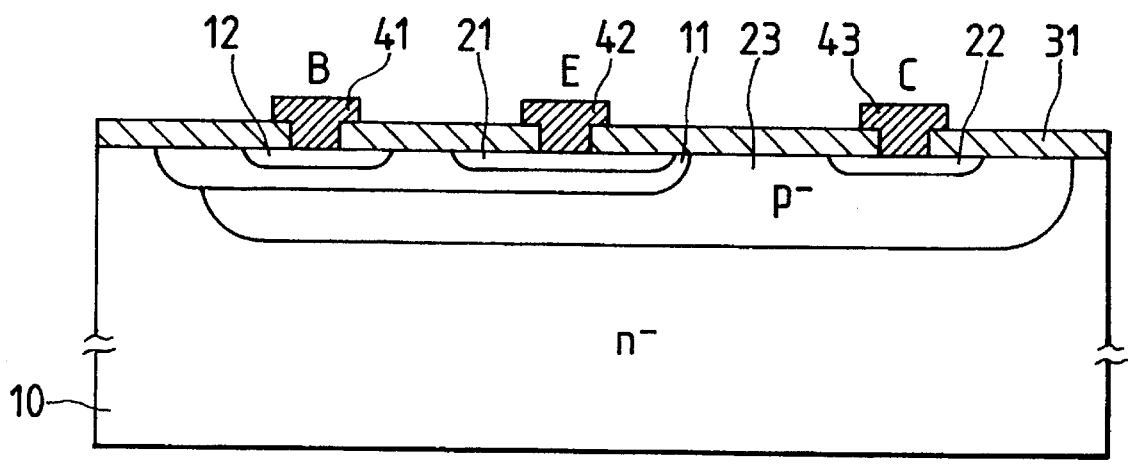
FIG. 7 is a cross-sectional view showing a third embodiment of a semiconductor device according to the present invention.

FIG. 7 shows a cross-sectional structure of p-n-p transistor of a third embodiment according to the present invention. In this third embodiment of the present invention, at least the region of the p-type emitter region 21 opposing to the p-type collector region 23 is formed with the same diffusion window of the n-type base region 11 in the first embodiment of the present invention.

As a result, in this third embodiment of the present invention, at the region in which the p-type emitter region 21 is opposed to the n-type base region 11, both the p-type emitter region 21 and the n-type base region 11 have a substantially concentric circular shape with respect to each other.

With the p-n-p transistor having the above stated construction, an interval (n-base width) formed between the p-type emitter region 21 and the p-type collector region 23 can be made narrow. Accordingly, the current amplification factor and the cutoff frequency can be improved.

Further, in this third embodiment of the present invention, the diffusion depth and the sheet resistance value of the p-type collector region 23 are 6 μm and 8 kΩ/□. The dimensions and the impurity concentration of the other portions have the same numeric values shown in the first embodiment of the present invention. For this reason, the p-type collector region 23 positioned just directly under the p-type emitter region 21 has the large value of 50 kΩ/□.

In the above stated p-n-p transistor, since the p-type collector region 23 positioned just directly under the p-type emitter region 21 has the high resistance, it contributes a little for the operation. For this reasons, in the interior portion of the transistor, the current mainly flows to the lateral direction parallel to the main surface of the semiconductor base substance 10.

In particular, with the above stated lateral type p-n-p transistor, the structure of this third embodiment has the following effects. Namely, since an interval (n-base width) formed between the p-type emitter region 21 and the p-type collector region 23 can be made narrow, even in a case where the current mainly flows toward for the lateral direction parallel to the main surface, the current amplification factor and the cutoff frequency can be improved.

According to the results by the inventors's study of the present invention, the characteristics of this transistor are as follows. In other words, the breakdown voltage between the collector and the emitter is 250 V and the cutoff frequency is 230 $MH_z$ at the collector current of 0.5 mA. The above cutoff frequency is remarkably higher than that of the conventional semiconductor device.

Further, each of the diffusion temperature and the time for forming the p-type collector region 23 is 1200° C. and 1000 minutes, respectively, in a case of the first embodiment according to the present invention.

However, in this third embodiment according to the present, each of the diffusion temperature and the time for forming the p-type collector region 23 is 1200° C. and 400 minutes, thereby the time for forming the p-type collector region 23 is made shorter as 400 minutes.

As a result, the diffusion depth of the n+ buried layer 19 is reduced at 8 μm from 11 μm. Further, the thickness of the mono-crystalline island shape region 3 can be reduced and the element dimension etc. can be made small.

Figure 8:
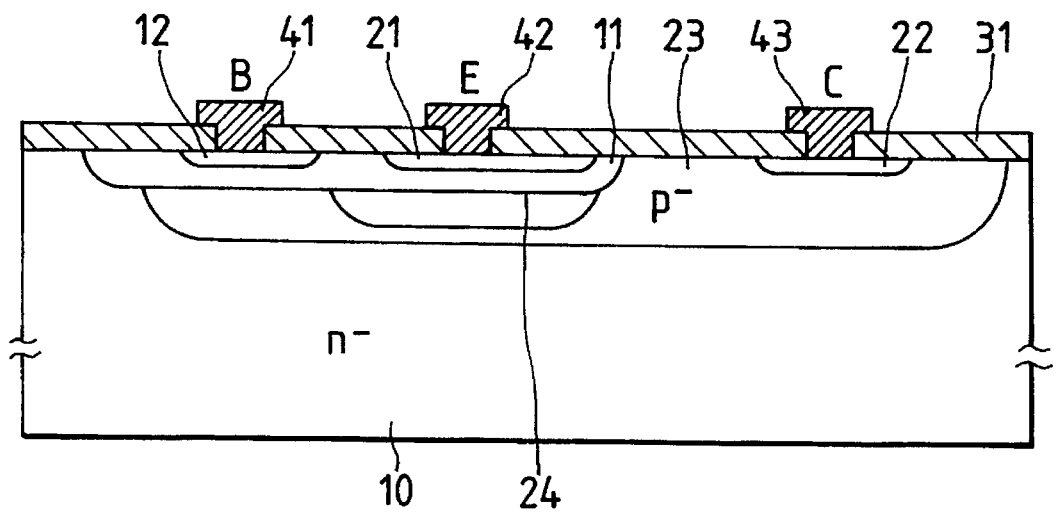
FIG. 8 is a cross-sectional view showing a fourth embodiment of a semiconductor device according to the present invention.

FIG. 8 shows a cross-sectional structure of p-n-p transistor of a fourth embodiment according to the present invention.

In this fourth embodiment according to the present invention, p-type semiconductor region 24 having the higher impurity concentration than that of the p-type collector region 23 is provided on the p-type collector region 23 positioned just directly under the p-type emitter region 21 in the third embodiment of the present invention.

By the provision of the p-type semiconductor region 24, the sheet resistance of the region for providing this semiconductor region 24 can be made small. For example, the sheet resistance is made as 8 kΩ/□, which is the same degree of the sheet resistance of the p-type collector region 23 arranged on the main surface.

Accordingly, since the collector resistance is made small, the cutoff frequency can be improved.

According to the results achieved by the inventors's study of the present invention, the characteristics of the transistor of the fourth embodiment according to the present invention are as follows. The breakdown voltage between the collector and the emitter is 250 V and the cutoff frequency is 310 $MH_z$ at the collector current of 0.5 mA. The above cutoff frequency is can be improved as compared with the first embodiment of the present invention.

Figure 9:
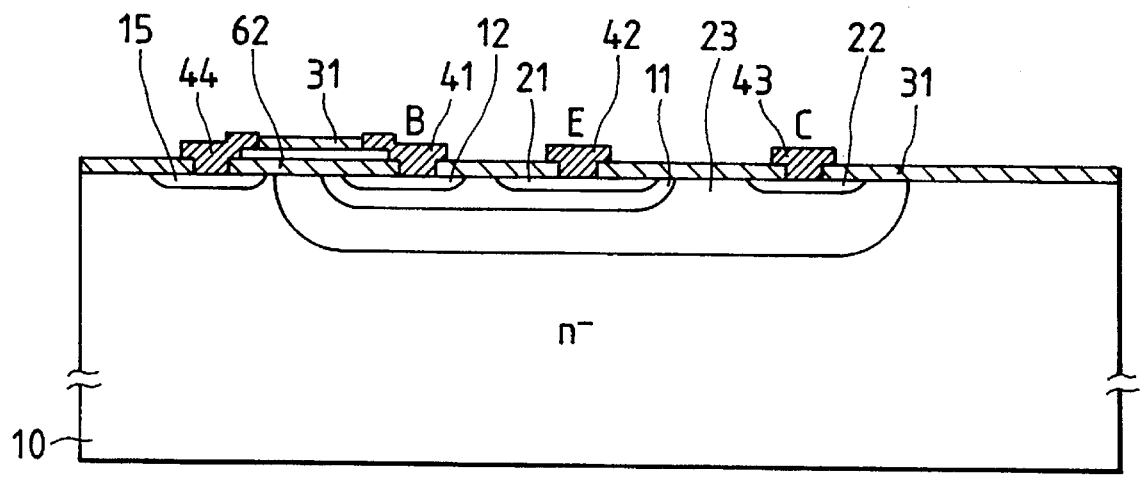
FIG. 9 is a cross-sectional view showing a fifth embodiment of a semiconductor device according to the present invention.

FIG. 9 shows a cross-sectional structure of p-n-p transistor of a fifth embodiment according to the present invention.

In this fifth embodiment according to the present invention, the n-type base region 11 is provided in the interior portion of the p-type collector region 23. Namely, an end portion of the n-type base region 11 does not project toward for the n-type semiconductor base substance 10 as shown in the former embodiment of the present invention.

n-type semiconductor region 15 is provided on the n-type semiconductor base substance 10 and the auxiliary electrode 44 for taking out the potential of the n-type semiconductor base substance 10 is provided and ohmicly contacts to the semiconductor region 15. A resistor 62 comprised of the mono-crystalline silicon formed on the insulating film 31 connects between the auxiliary electrode 44 and the base electrode 41.

As a result, independently of the dimensions and the impurity concentrations of the respective semiconductor regions, the resistance value for connecting the n-type base region 11 and the n-type semiconductor base substance 10 can be determined.

Namely, regardless of the relation of the transistor structure, the high resistance value can be set. As a result, the cutoff frequency can be improved as shown in FIG. 3.

Further, in this fifth embodiment according to the present invention, in particularly, in a case that the n-type semiconductor base substance 10 has the low resistance value, the remarkable effects can be obtained.

Namely, since the resistance value can be heightened regardless of the relation of the resistivity of the n-type semiconductor base substance 10, even in the semiconductor device having the low resistivity the lowering in the cutoff frequency can be prevented.

Figure 10:
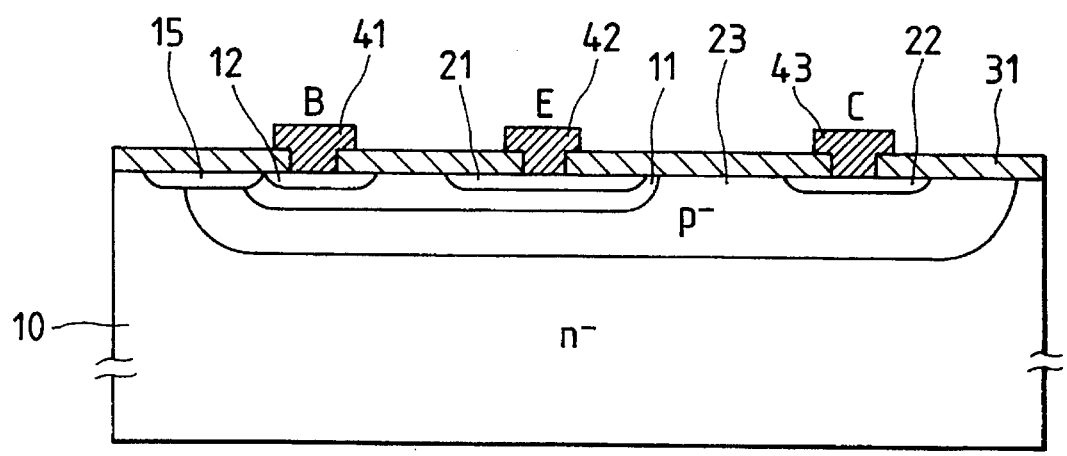
FIG. 10 is a cross-sectional view showing a sixth embodiment of a semiconductor device according to the present invention.

FIG. 10 shows a cross-sectional structure of p-n-p transistor of a sixth embodiment according to the present invention.

In this sixth embodiment according to the present invention, the n-type base region 11 is provided in the interior portion of the p-type collector region 23. The n-type semiconductor base substance 10 and the n-type base region 11 are connected through the n-type semiconductor region 15.

According to the above sixth embodiment of the present invention, the resistance value of the n-type semiconductor region 15 can be adjusted according to the impurity concentration or to the dimensions of the n-type semiconductor region 15.

As a result, even when the resistivity of the n-type semiconductor base substance 10 is small and further the impurity concentration of the n-type base region 11 is high, the resistance for connecting the n-type semiconductor base substance 10 and the n-type base region 11 can be made large. Accordingly, the cutoff frequency can be improved.

Figure 11:
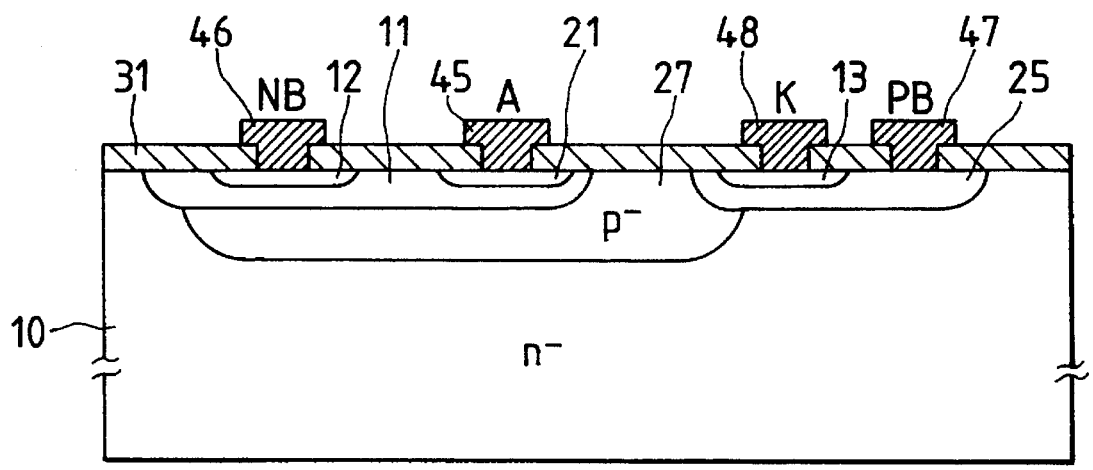
FIG. 11 is a cross-sectional view showing a seventh embodiment of a semiconductor device according to the present invention.

FIG. 11 shows a cross-sectional structure of a lateral type thyrister of a seventh embodiment according to the present invention.

p-type base region (a first semiconductor region) 27 is provided on the main surface of the n-type semiconductor base substance 10. The p-type base (a second semiconductor region) 11 is provided on the p-type base region 27.

A conjunction depth of the p-type base region 11 is shallower than that of the p-type base region 27. Further, the impurity concentration of the p-type base region 11 is larger than that of the p-type-base region 27.

The n-type base region 11 is connected to the n-type semiconductor base substance 10 at an end portion (a left end portion in FIG. 11) for contacting the main surface. Further, the p-type emitter region 21 (a third semiconductor region) is provided on the interior portion of the n-type base region 11.

In this seventh embodiment according to the present invention, the p-type base region 27 is positioned just directly under the p-type emitter region 21. The above structure has the same structure shown in the p-n-p transistor in the first embodiment of the present invention.

In this seventh embodiment according to the present invention, p-type semiconductor region 25 (a fourth semiconductor region) is provided so as to contact to the p-type base region 27.

A conjunction depth of the p-type semiconductor region 25 is shallower than that of the p-type base region 27 and the impurity concentration of the p-type semiconductor region 25 is larger than that of the p-type base region 27.

Further, n-type emitter region 13 (a fifth semiconductor region) is provided in the interior portion of the p-type semiconductor region 25. A conjunction depth of the n-type emitter region 13 is shallower than that of the p-type semiconductor region 25 and the impurity concentration of the n-type emitter region 13 is larger than that of the p-type semiconductor region 25.

An anode electrode (A) 45 (a first main electrode) contacts ohmicly to the p-type emitter region 21 and further a cathode electrode (K) 48 (a second main electrode) ohmicly contacts to the n-type emitter region 12.

Further, a cathode side gate electrode (PB) 47 (a first control electrode) ohmicly contacts to the p-type semiconductor region 25 and an anode side gate electrode (NB) 46 (a second control electrode) ohmicly contacts to the n+ region 12 provided in the n-type base region 11. As to these gate electrodes 47 and 46, only one of the gate electrodes 47 and 46 may be provided on the thyrister.

Each of dimension of the respective part of the thyrister in this seventh embodiment according to the present invention will be explained as following.

The conjunction depth and the surface concentration of the p-type base region 25 are 4 μm and $5 \times 10^{18}/cm^3$. The conjunction depth and the surface concentration of the n-type emitter region 13 are 1 μm and $1 \times 10^{20}/cm^3$. The other parts of the thyrister has the same dimensions shown in the first embodiment of the present invention.

According to this seventh embodiment according to the present invention, as stated on the first embodiment of the present invention, the current amplification factor of the p-n-p transistor portion is made large.

As a result, the trigger current and the holding current of the thyrister can be made small and also the "on" voltage on the thyrister can be made small. Further, the "turn-off" operation of the thyrister can be made speedy.

Figure 12:
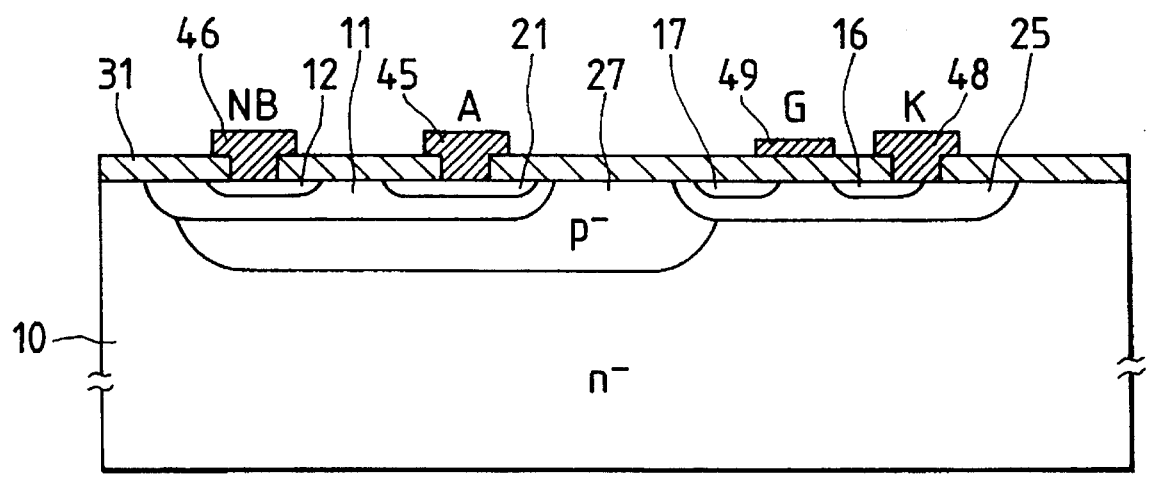
FIG. 12 is a cross-sectional view showing an eighth embodiment of a semiconductor device according to the present invention.

FIG. 12 shows a cross-sectional structure of an insulating gate type thyrister of an eighth embodiment according to the present invention.

In this MOS control type thyrister is called as "an emitter switching thyrister". A floating emitter being not contacted to the electrode is controlled through an insulating gate.

Different portions in this eight embodiment according to the present invention comparing with the above seventh embodiment of the present invention are as followings.

First of all, n-type source region 16 (a fifth semiconductor region) and n-type drain region 17 (a sixth semiconductor region) are provide at the interior portion of the p-type semiconductor region 25. Each of the n-type source region 16 and the n-type drain region 17 is arranged shallower than the p-type semiconductor region 25 and has the higher impurity concentration than that of the p-type semiconductor region 25, respectively.

An insulating gate 49 is provided on a surface of the p-type semiconductor region 25 through the insulting film 31. Further, the cathode electrode (K) 48 ohmicly contacts to the n-type source region 16 and the p-type base region 25. The n-type drain region 17 forms an emitter region of a floating cathode side.

The n-type drain region 17 gives the gate voltage signal to the insulating gate electrode (G) 49 and forms a channel on the surface of the p-type semiconductor region 25. The n-type drain region 17 connects to the cathode electrode (K) 48 thorough the channel and the n-type source region 16.

In this eighth embodiment according to the present invention, similarly to the seventh embodiment of the present invention, the "on" voltage of the thyrister is made small and the "turn-off" operation of the semiconductor device is made speedy.

Figure 13:
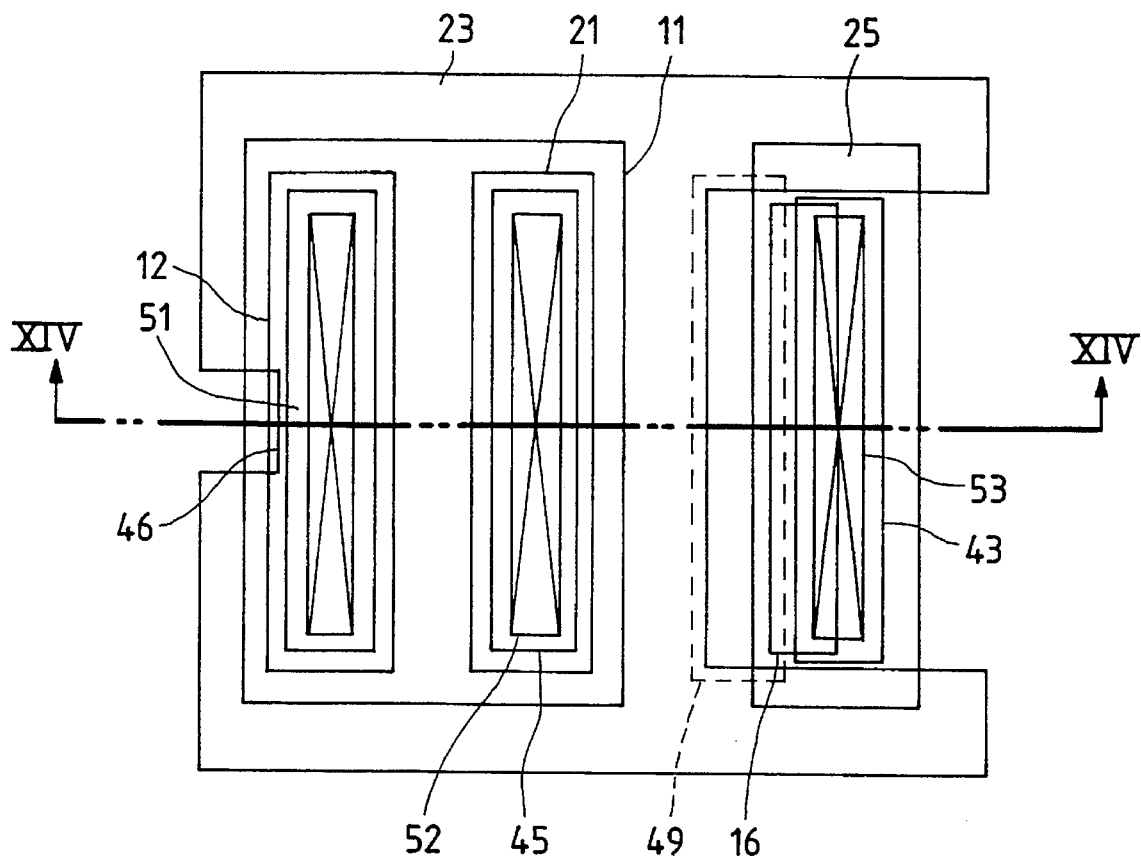
FIG. 13 is a plan view of a ninth embodiment of a semiconductor device according to the present invention.
Figure 14:
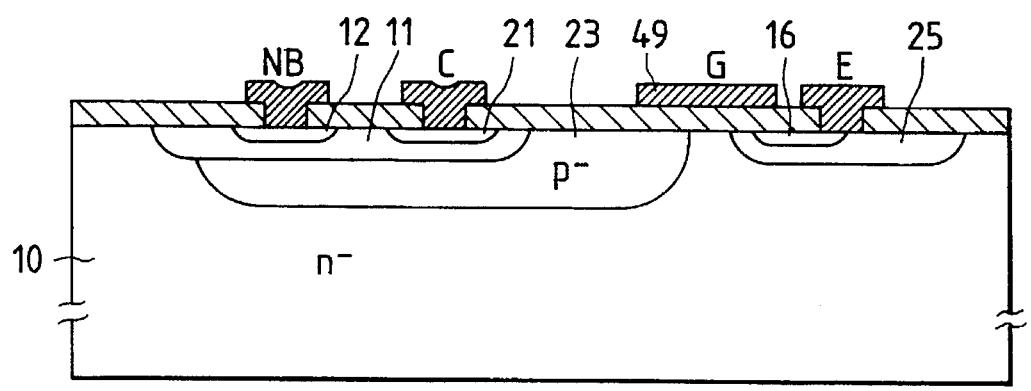
FIG. 14 is a cross-sectional view showing the ninth embodiment of the semiconductor device according to the present invention.

FIG. 13 and FIG. 14 show IGBT (insulated gate bipolar transistor) of a ninth embodiment according to the present invention.

In the transistor of this ninth embodiment according to the present invention, each of the p-type emitter region 23, the n-type base region 11, the n+ region 12 and the p-type base region 23 has the same structure shown in the first embodiment of the present invention.

In the transistor of this ninth embodiment according to the present invention, the p-type semiconductor region 25 is provided separately from the p-type base region 23. The n-type source region 16 is provided in the interior portion of the p-type semiconductor region 25. This n-type source region 16 is arranged hallower than the p-type semiconductor region 25 and has the higher impurity concentration that of the p-type semiconductor region 25.

A collector electrode (C) (a first main electrode) ohmicly contacts to the p-type emitter region 21. Further, an emitter electrode (E) ohmicly contacts to the n-type source region 16 and the p-type semiconductor region 24. Further, the emitter electrode (E) ohmicly contacts to the n-type base region 23 and the p-type semiconductor region 25.

Further, an insulating gate electrode 49 is provided on the surface between the p-type base region 23, the p-type semiconductor region 25 and the n-type source region 16 and on the surface of the n-type semiconductor base substance 10 between the p-type base region 23 and the p-type semiconductor region 25.

In the transistor of this ninth embodiment according to the present invention, with respect to the element characteristics, the current amplification factor and the speed of the n-p-n-type transistor is made large, the "on" voltage of the transistor can be made small and the "turn-off" operation of the transistor can be made speedy.

In the above stated various embodiments according to the present invention, it will be explained about the n-type p-n-type transistor formed on the n-type base substance. However, even the conductive type in each semiconductor region is formed reversely, the similar effects can be obtained.

According to the above stated various embodiments of present invention, in the lateral type semiconductor device, the operation can be made speedy without the lowering in the breakdown voltage. As a result, since the lateral type semiconductor device having the equal frequency characteristic those of the vertical structure semiconductor device can be realized, thereby the performance of the bipolar linear IC using both devices together can be improved.

Hereinafter, other semiconductor devices according to the present invention will be explained.

Figure 15:
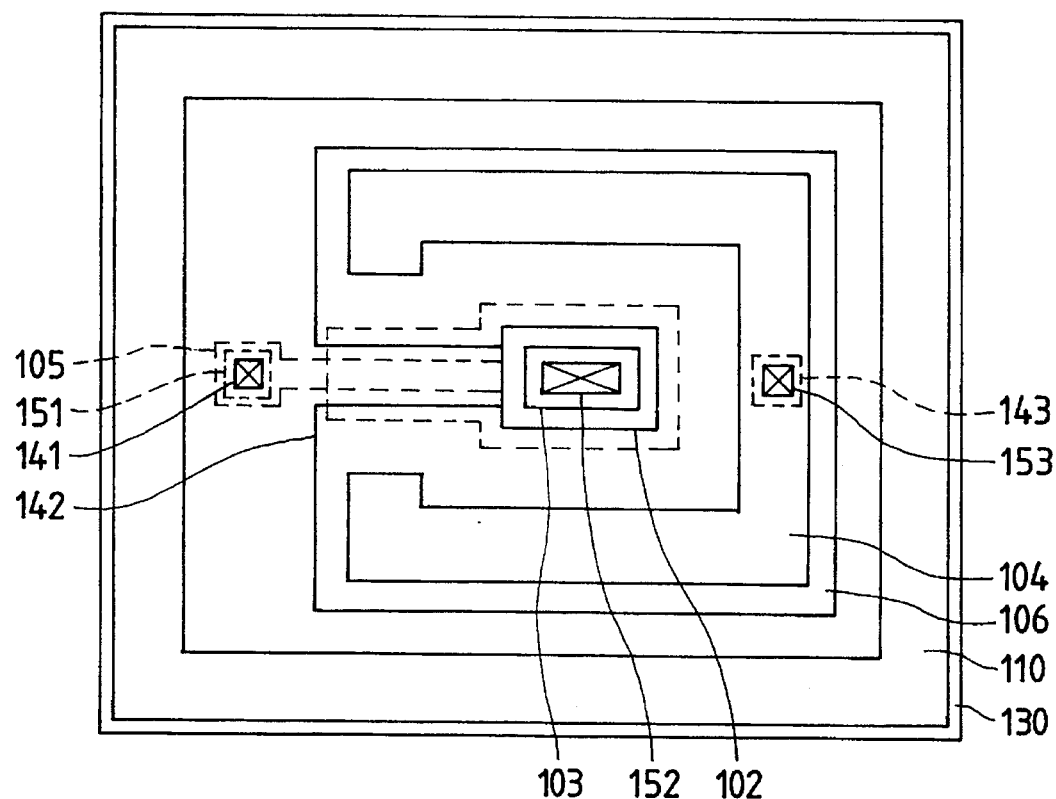
FIG. 15 is a plan view showing tenth embodiment of a semiconductor device according to the present invention.
Figure 16:
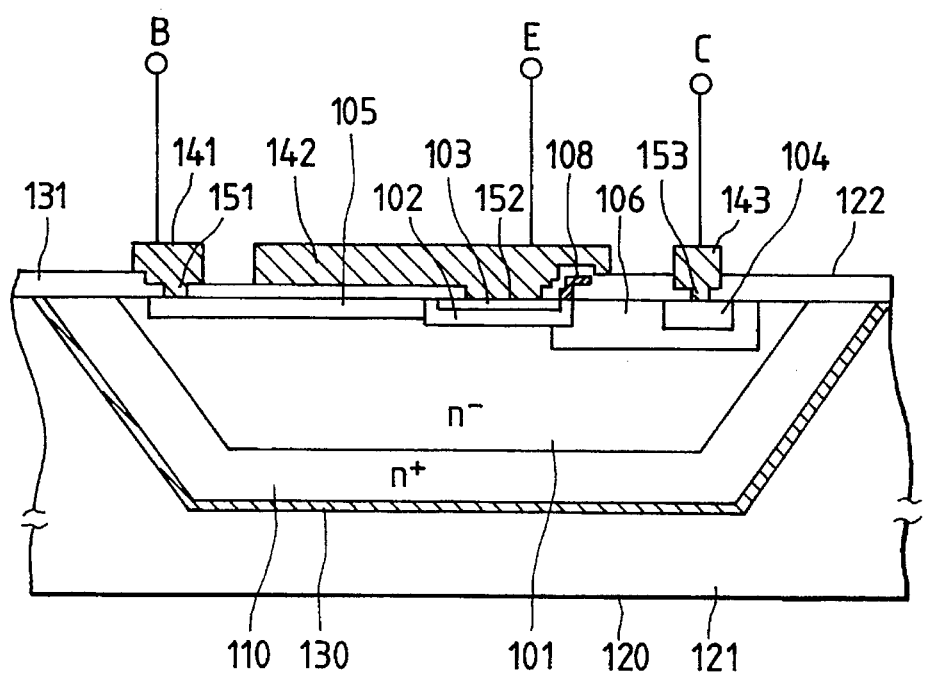
FIG. 16 is a cross-sectional view showing the tenth embodiment of the semiconductor device according to the present invention.

Each of FIG. 15 and FIG. 16 is a plan view and a cross-sectional view of a lateral p-n-p transistor showing a tenth embodiment according to the present invention, respectively.

In FIG. 15 and FIG. 16, a base substance region 101 is a first region and the base substance region 101 is buried in an island shape by providing n-type buried region 110, which contacts to a poly-crystalline silicon 121 through an insulating layer 130, and exposes one side of a main surface 122 of a semiconductor substrate 120.

A n-base region 102 extends from a part of the main surface 122 of the base substance region 101, this n-base region 102 is a second region having a higher impurity concentration than that of the base substance region 101 and has n-type conductivity.

An emitter region 103 extends over an interior portion from an exposed face of the base region 102, this emitter region 103 is a third region having a higher impurity concentration than that of the base region 102 and has p-type conductivity.

A collector region 104 extends over an interior portion from the main surface 122 of the base substance region 101, this collector region 104 opens a part at a circular form for separately surrounding around the n-base region 102 with a predetermined distance in the main surface 122 and is a fourth region having a higher impurity concentration than that of the base substance region 101 and further has p-type conductivity.

A connection base region 105 extends over to an interior portion from the main surface 122 of the base substance region 101 and extends further keeps a distance in which one end connects to the n-base region 102 and other end passe through an opened portion of the collector region 104, this connection base region 105 has a higher concentration region than that of the base region 102.

A p-collector region 106 extends over to an interior portion from the main surface 122 of the base substance region 101 and contacts to the interval between the n-base region 102 and the collector region 104 and is arranged to make a gap in which the base substance region 101 appears in the surface at a part at the interval the connection base region 105. The p-collector region 106 has a low impurity concentration than that of the collector region 104 and forms a sixth region.

An insulating film 131 is formed on one side of the main surface 122 of the semiconductor substrate 120, and a base electrode 141 forms a third electrode which connects under the low resistance with at least one part of the base region 105 through an opening portion 151 of the insulating film 131 and further forms B terminal.

An emitter electrode 142 forms a first electrode which connects under the low resistance with at least one part of the emitter region 103 through the opening portion 152 of the insulating film 131 and covers a part of the base region 102 opposed to the collector region 104 and the connection base region 105 and the p-collector region 106 and further forms E terminal.

A collector electrode 143 is a third electrode which connects under the low resistance with at least one part of the collector region 104 through an opening portion 153 of the insulating film 131.

The collector electrode 143 covers a part of the collector region 104, a part of the p-collector region 106 of a direction opposed to the n-base region extending on the collector region 104 and a part of the base substance region 101 exposed on the main surface of an outer peripheral direction of the collector region and further forms C terminal.

A poly-crystalline silicon thin film 108 is same impurity diffusion window for forming the n-base region 102 and the emitter region 103 and is buried in the insulating film 131.

The exemplified examples of each dimension in this tenth embodiment according to the present invention will be explained as followings.

The thickness of the mono-crystalline island shape region 101 is 40 µm, each of the diffusion concentration and the diffusion depth of the buried layer 110 is $5 \times 10^{18}/cm^3$ and 10 µm, respectively, and each of the diffusion concentration and the diffusion depth of the n-base region 102 is $2 \times 10^{17}/cm^3$ and 2.5 µm, respectively.

Each of the diffusion concentration and the diffusion depth of the emitter region 103 is $5 \times 10^{15}/cm^3$ and 0.5 µm, respectively, and each of the diffusion concentration and the diffusion depth of the collector region 104 is $1 \times 10^{18}/cm^3$ and 3.5 µm, respectively.

Each of the diffusion concentration and the diffusion depth of the connection base region 105 is $1 \times 10^{20}/cm^3$ and 2.0 µm, respectively, and each of the diffusion concentration and the diffusion depth of the p-collector region 106 is $6 \times 10^{15}/cm^3$ and 5.0 µm, respectively.

Further, the distance between the base region 102 and the connection base region 105 and the collector region 104 is 15 µm, the distance between the collector region 104 and the buried layer 110 is 15 µm, and the length from the base region 102 and the connection base region 102 of the emitter electrode 142 toward for the p-collector region 106 is 8 µm.

Further, the interval between the connection base region 105 and the p-collector region 106 is 7 µm with a photomask interval. An emitter electrode area contacted to the emitter diffusion layer is 3 µm×3 µm, and each of the vertical length and the lateral length of the emitter diffusion layer is 15 µm, respectively.

According to the transistor of the above tenth embodiment of the present invention, in comparison with the conventional semiconductor device in which the connection base region 105 across over the p-collector region 106, the p-concentration can be improved about 10% without the lowering in the breakdown voltage.

The element characteristics are the breakdown voltage $BV_{CEO}$ between the collector and the emitter is about 150 V, and the current amplification factor is about 130 and the cutoff frequency $f_T$ is about 230 $MH_z$. Since the concentration of the p-collector region 106 is improved, the collector resistance decreases and the cutoff frequency $f_T$ can be improved about 7%.

Figure 17:
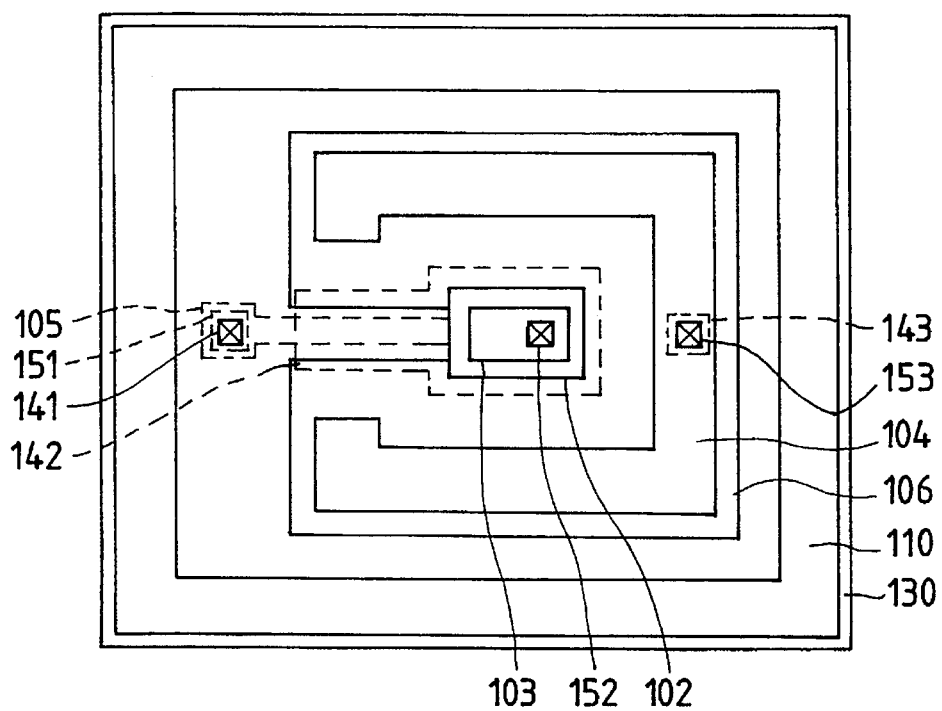
FIG. 17 is a plan view showing an eleventh embodiment of a semiconductor device according to the present invention.

FIG. 17 is a plan view showing a lateral type p-n-p transistor of an eleventh embodiment according to the present invention.

Comparing with the tenth embodiment of the present invention, in this transistor structure of the eleventh embodiment of the present invention, so as to make large the current capacity the emitter region 103 is lengthen toward for an opposite direction with the connection base region 105, and further a contact region 152 of the emitter region 103 is arranged biasedly toward of an opposite direction of the connection base region 105.

Other structures of the eleventh embodiment of the present invention are similar to the those of the tenth embodiment of the present invention.

The contact region 152 of the emitter for connecting to the emitter region 103 is 3 μm×3 μm, each of the width and the length of the emitter region 103 is 15 m and 50 m, respectively.

The characteristics of this element are that the breakdown voltage $BV_{CEO}$ between the collector and the emitter is about 150 V, the current amplification factor is about 130 and the cutoff frequency $f_T$ about 180 $MH_z$. Further, comparing with the transistor structure in which the contact region 152 is not arranged biasedly, thereby the current capacity can be improved about 10%.

Figure 18:
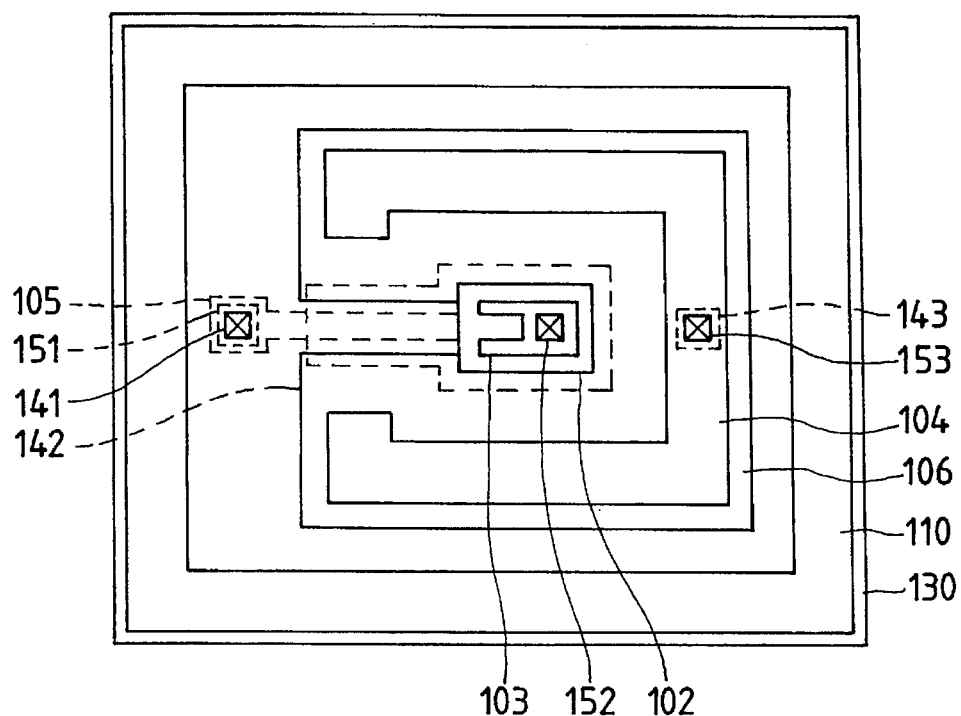
FIG. 18 is a plan view showing a twelfth embodiment of a semiconductor device according to the present invention.

FIG. 18 is a plan view showing a lateral type p-n-p transistor of a twelfth embodiment according to the present invention.

Comparing with the eleventh embodiment of the present invention, in this transistor structure of the twelfth embodiment of the present invention, so as to make large the current capacity, in particular when the emitter region 103 is lengthen toward for the lateral direction the current in proportional to the length of the emitter region 103, a part of the emitter portion for consisting to the collector region 104 and for effectively operating except for the lateral direction emitter is removed, thereby the surface of the base region 102 is exposed.

Other transistor structures of this twelfth embodiment according to the present invention are similar to those of the eleventh embodiment of the present invention.

According to this transistor structure of this twelfth embodiment according to the present invention, since the base resistance of the transistor is made small, the voltage difference between the emitter and the base from the close portion and the distant portion of the base electrode, as a result, it is advantageous for a case of the lengthen of the emitter region 103.

The characteristics of this element are that the breakdown voltage $BV_{CEO}$ between the collector and the emitter is about 150 V, the current amplification factor is about 130, and the cutoff frequency $f_T$ is about 190 $MH_z$ and those are substantially similar to those of the eleventh embodiment of the present invention. Further, the current capacity of the transistor can be improved about 10%.

Figure 19:
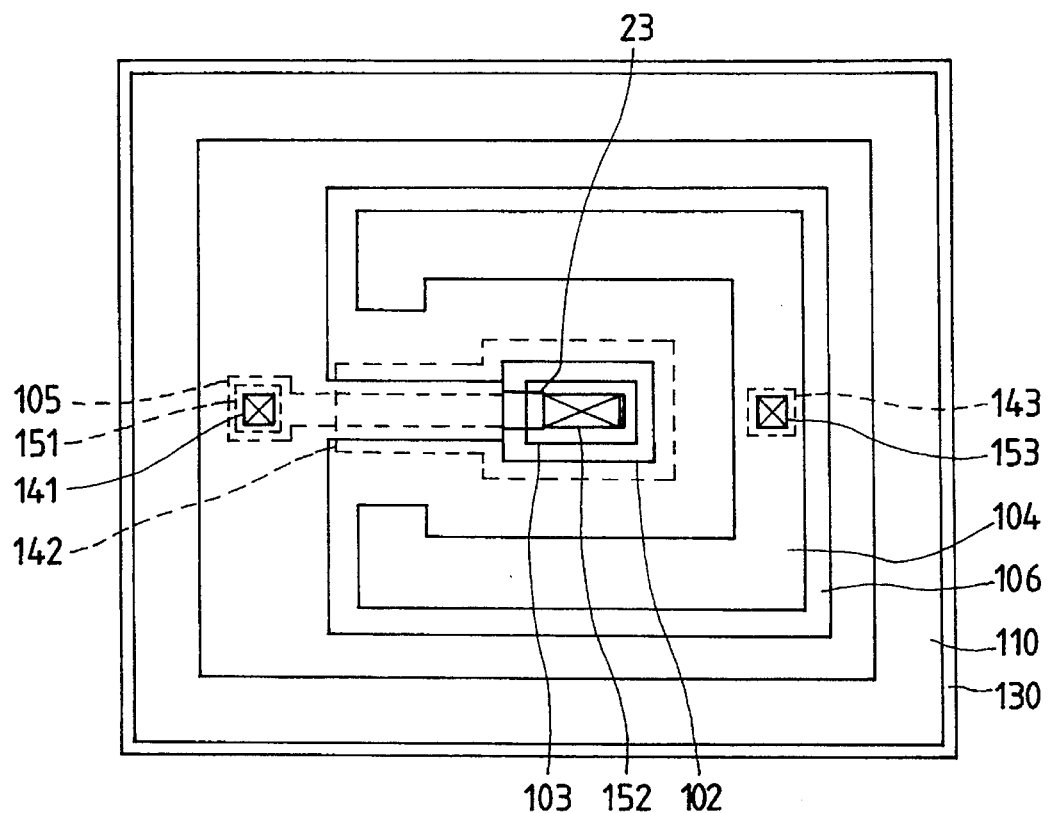
FIG. 19 is a plan view showing a thirteenth embodiment of a semiconductor device according to the present invention.
Figure 20:
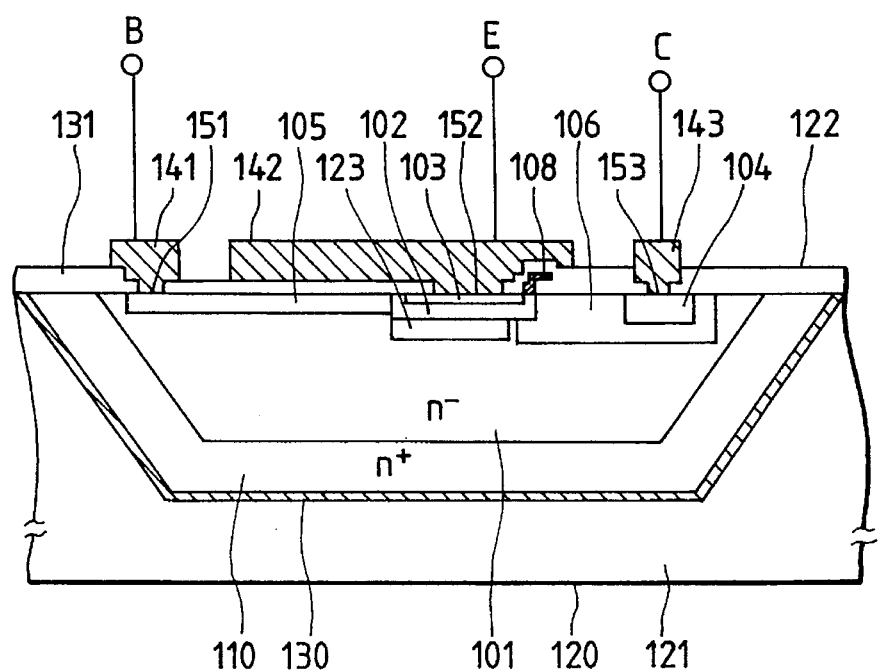
FIG. 20 is a cross-sectional view showing the thirteenth embodiment of the semiconductor device according to the present invention.
Figure 21:
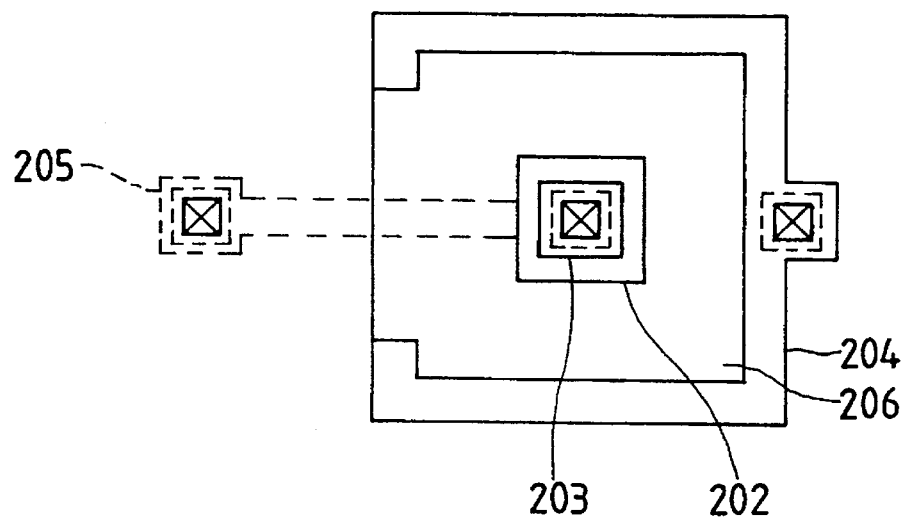
FIG. 21 is a plan view showing a semiconductor device according to the prior art.
Figure 22:
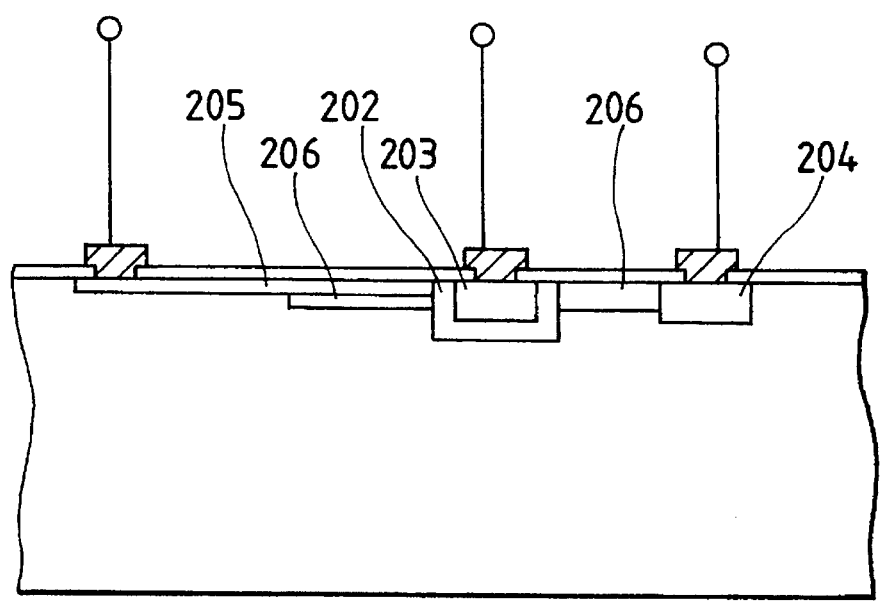
FIG. 22 is a cross-sectional view the semiconductor device according to the prior art.

Each of FIG. 19 and FIG. 20 is a plan view and a cross-sectional view showing a lateral type p-n-p transistor of a thirteenth embodiment according to the present invention, respectively.

Comparing with the tenth embodiment of the present invention, in this transistor structure of the thirteenth embodiment according to the present invention, so as to make large the current capacity, when the emitter region 103 is lengthen toward for the lateral direction the current in proportional to the length of the emitter region 103, a part of the emitter portion for consisting to the collector region except for the lateral direction emitter, in other words in the lower portion of the emitter region 103, a second base region 123 forming a seventh semiconductor which is the n-type base low resistance having the same polarity of the base is provided.

Other structures of the thirteenth embodiment according to the present invention are similar to those of the tenth embodiment of the present invention.

Each of the surface concentration and the diffusion depth of the second base region 123 is $5×10^{18}/cm^3$ and 4 μm, respectively.

According to this transistor structure of the thirteenth embodiment according to the present invention, since the base resistance is made small, the voltage difference between the emitter and the base from the close portion and the distant portion of the base electrode, as a result, it is advantageous for a case of the lengthen of the emitter region 103.

The characteristics of this element are that the breakdown voltage $BV_{CEO}$ between the collector and the emitter is about 150 V, the current amplification factor is about 130, and the cutoff frequency $f_T$ is about 150 $MH_z$ and those are substantially similar to those of the twelfth embodiment of the present invention. Further, the current capacity of the transistor can be improved about 20%.

Further, these embodiments are not limited to the dielectric body separation substrate but the effects can be obtained by using pn-separation plate etc.

According to the various semiconductor devices of the embodiments shown from the tenth embodiment to the thirteenth embodiment according to the present invention, the collector resistance can be made small without the lowering in the breakdown voltage, as a result, the high frequency of the transistor can be obtained.

Further, so as to make large the current capacity when the emitter region length is lengthen the current capacity substantially corresponding to the emitter region length can be obtained, the high frequency p-n-p transistor suitable for the high frequency linear type IC can be provided.

We claim:

1. A semiconductor device comprising:

a semiconductor base substance of a first conductivity type having a main surface;

a first semiconductor region of a second conductivity type provided on the main surface of said semiconductor base substance;

a second semiconductor region of the first conductivity type provided on said first semiconductor region, said second semiconductor region forming a base region and having an impurity concentration higher than an impurity concentration of said first semiconductor region;

a third semiconductor region of the second conductivity type provided on said second semiconductor region;

a resistance region for connecting said semiconductor base substance to said second semiconductor region;

a first electrode for ohmically contacting said first semiconductor region;

a second electrode for ohmically contacting said second semiconductor region;

a third electrode for ohmically contacting said third semiconductor region; and wherein said semiconductor base substance is an element separate from said first, second, and third semiconductor regions, wherein said semiconductor base substance and said second semiconductor region have the same potential.

2. A semiconductor device comprising:

a semiconductor base substance of a first conductivity type;

a first semiconductor region of a second conductivity type provided on a main surface of said semiconductor base substance;

a second semiconductor region of a second conductivity type provided on said first semiconductor region, said second semiconductor region forming a base region and having an impurity concentration higher than an impurity concentration of said first semiconductor region;

a third semiconductor region of a second conductivity type provided on said second semiconductor region;

said first semiconductor region provided just directly under said third semiconductor region;

a resistance region, provided in an interior portion of said semiconductor base substance, for connecting said semiconductor base substance to said second semiconductor region;

a first electrode for ohmicly contacting said first semiconductor region;

a second electrode for ohmicly contacting said second semiconductor region;

a third electrode for ohmicly contacting said third semiconductor region; and wherein said semiconductor base substance is an element separate from said first, second, and third semiconductor regions, and wherein said semiconductor base substance and said second semiconductor region have the same potential.

3. A semiconductor device according to claim 2, wherein said second semiconductor region is connected to said semiconductor base substance at an end portion of said second semiconductor region which contacts to said main surface of said semiconductor base substance.

4. A semiconductor device according to claim 2, wherein said second semiconductor region provides a projecting portion having a conductivity type equal to the conductivity type of said second semiconductor region and projecting toward said semiconductor base substance, said projecting portion forming a resistance region for connecting said semiconductor base substance to said second semiconductor region.

5. A semiconductor device according to claim 2, further comprising:

a portion provided directly under said second semiconductor region, said portion partially contacting said first semiconductor region and forming a resistance region for connecting said semiconductor base substance to said second semiconductor region.

6. A semiconductor device according to any one of claims 1 to 5, further comprising:

a region in which said second semiconductor region and said third semiconductor region oppose each other, said second semiconductor region and said third semiconductor region being formed in a substantially concentrically circular shape.

7. A semiconductor device according to any one of claims 1 to 5, wherein at said first semiconductor region provided directly under said third semiconductor region, a semiconductor region is provided having a conductivity type equal to the conductivity type of said first semiconductor region and having an impurity concentration higher than that of said first semiconductor region.

8. A semiconductor device according to any one of claims 1 and 2, wherein said resistance region is a poly-crystalline semiconductor region provided on an insulating substance on the main surface of said semiconductor base substance.

9. A semiconductor device according to any one of claims 1 to 5, wherein at said first semiconductor region provided directly under said third semiconductor region, a semiconductor region is provided having a conductivity type equal to the conductivity type of said first semiconductor region and having an impurity concentration higher than that of said first semiconductor region.

10. A semiconductor device comprising:

a semiconductor base substance of a first conductivity type;

a first semiconductor region of a second conductivity type provided on a main surface of said semiconductor base substance;

a second semiconductor region of the first conductivity type provided on said first semiconductor region, said second semiconductor region forming a base region and having an impurity concentration higher than that of said first semiconductor region;

a third semiconductor region of the second conductivity type provided on said second semiconductor region;

a fourth semiconductor region of the second conductivity type provided for contacting to said first semiconductor region;

a fifth semiconductor region of the first conductivity type provided on said fourth semiconductor region;

said first semiconductor region being positioned just directly under said third semiconductor region;

a resistance region, provided at an interior portion of said semiconductor base substance, for connecting said semiconductor base substance to said second semiconductor region;

a first main electrode for ohmicly contacting said first semiconductor region;

a second main electrode for ohmicly contacting said fifth semiconductor region;

a control electrode for ohmicly contacting one selected from said second semiconductor region and said fourth semiconductor region; and wherein said semiconductor base substance is an element separate from said first, second, and third semiconductor regions, and wherein said semiconductor base substance and said second semiconductor region have the same potential.

11. A semiconductor device comprising:

a semiconductor base substance of a first conductivity type;

a first semiconductor region of a second conductivity type provided on a main surface of said semiconductor base substance;

a second semiconductor region of the first conductivity type provided on said first semiconductor region, said second semiconductor region forming a base region and having an impurity concentration higher than that of said first semiconductor region;

a third semiconductor region of the second conductivity type provided on said second semiconductor region;

a fourth semiconductor region of the second conductivity type provided for contacting to said first semiconductor region;

a fifth semiconductor region of the first conductivity type provided on said fourth semiconductor region;

a a sixth floating semiconductor region of the first conductivity type provided on said fourth semiconductor region;

wherein said first semiconductor is positioned just directly under said third semiconductor region;

a resistance region, provided in an interior portion of said semiconductor base substance, for connecting said semiconductor base substance to said second semiconductor region;

a first main electrode for ohmicly contacting said third semiconductor region;

a second main electrode for ohmicly contacting said fifth semiconductor region;

a control electrode ohmicly contacting said second semiconductor region;

an insulating gate electrode provided on a surface of said fourth semiconductor region positioned between said fifth semiconductor region and said sixth semiconductor region through an insulating film; and wherein said semiconductor base substance is an element separate from said first, second, and third semiconductor regions, and wherein said semiconductor base substance and said second semiconductor region have the same potential.

12. A semiconductor device comprising:

a semiconductor base substance of a first conductivity type;

a first semiconductor region of a second conductivity type provided on a main surface of said semiconductor base substance;

a second semiconductor region of the first conductivity type provided on said first semiconductor region, said second region forming a base region and having an impurity concentration higher than that of said first semiconductor region;

a third semiconductor region of the second conductivity type provided on said second semiconductor region;

a fourth semiconductor region of the second conductivity type provided separately from said first semiconductor region;

a fifth semiconductor region of the first conductivity type provided on said fourth semiconductor region;

said first semiconductor being positioned just directly under said third semiconductor region;

a resistance region, provided in an interior portion of said semiconductor base substance, for connecting said semiconductor base substance to said second semiconductor region;

a first main electrode for ohmicly contacting said third semiconductor region;

a second main electrode for ohmicly contacting said fifth semiconductor region;

wherein, on a surface of said semiconductor base substance, an insulating gate electrode is extendingly provided on said first semiconductor region, said semiconductor base substance being positioned between said first semiconductor region and said fourth semiconductor region, said fourth semiconductor region, and said fifth semiconductor region through an insulating film, and wherein said semiconductor base substance and said second region have the same potential.

13. A semiconductor device comprising:

a first semiconductor region of a first conductivity trade having a main surface, said first region forming a base region;

a second semiconductor region of the first conductivity type provided on an interior portion of the main surface of said first semiconductor device;

a third semiconductor region of a second conductivity type provided on an interior portion from an exposed face of said second semiconductor region, said third semiconductor region forming a base region and having a higher impurity concentration than that of said second semiconductor region;

a fourth semiconductor region of the second conductivity type provided on an interior portion from said one main surface of said first semiconductor region and having a substantially circular shape opened exposed face, said fourth semiconductor region for substantially surrounding around said second semiconductor region and having a higher impurity concentration than that of said first semiconductor region;

a fifth semiconductor region of the first conductivity type provided on an interior portion from said main surface of said first semiconductor region and having one end thereof connected to said second semiconductor region and another end thereof passed through said opened portion of said fourth semiconductor region and separately extending to said second semiconductor region, said fifth semiconductor region having a higher impurity concentration than that of said first semiconductor region and than that of said second semiconductor region;

a sixth semiconductor region of the second conductivity type positioned between said second semiconductor region and said fourth semiconductor region and contacted to said second semiconductor region and said fourth semiconductor region, said sixth semiconductor region provided on an interior portion from said one main surface of said first semiconductor region in a space at an outer peripheral side of said fifth semiconductor region, said sixth semiconductor region having a higher impurity concentration than that of said first semiconductor region and having a lower impurity concentration than that of said fourth semiconductor region;

a first electrode for ohmicly contacting a first opened portion which forms an exposed surface of said third semiconductor region through an insulating material which is formed on said second semiconductor region and on one main surface of at least part of said sixth semiconductor region;

a second electrode for ohmicly contacting a second opened portion which forms an exposed face of said fourth semiconductor region;

a third electrode for ohmicly contacting a third opened portion which forms an exposed face of said fifth semiconductor region; and wherein said first and third semiconductor regions have the same potential.

14. A semiconductor device according to claim 13, wherein said first opened portion on said exposed face of said third semiconductor region ohmicly contacts by separating biasing from said fifth semiconductor region.

15. A semiconductor device according to claim 14, wherein at least part except for not opposed to said fourth semiconductor region forms partially removed in a shape on said third semiconductor region.

16. A semiconductor device according to any one of claims 13 and 14, wherein a seventh semiconductor region of the first conductivity type is formed on a side opposed to said main surface of said fourth semiconductor region, said seventh semiconductor region is smaller than said second semiconductor region and extends to an interior portion from said one main surface of said first semiconductor region, and further said seventh semiconductor region is formed deeper than said second semiconductor region and has a lower impurity concentration than that of said third semiconductor region.

17. A semiconductor device according to any one of claims 1 to 5 and 10–15, wherein said first semiconductor region forms one of a plural island regions which are put side by side by mutually and electrically insulating one side of a main surface of a semiconductor substrate.

18. A semiconductor device according to any one of claims 1 to 5 and 10–15, wherein the semiconductor device is used as a high frequency p-n-p transistor.

* * * * *